United States Patent
Koeplinger et al.

(10) Patent No.: US 10,768,899 B2
(45) Date of Patent: Sep. 8, 2020

(54) MATRIX NORMAL/TRANSPOSE READ AND A RECONFIGURABLE DATA PROCESSOR INCLUDING SAME

(71) Applicant: SambaNova Systems, Inc., Palo Alto, CA (US)

(72) Inventors: David Alan Koeplinger, Menlo Park, CA (US); Raghu Prabhakar, Sunnyvale, CA (US); Ram Sivaramakrishnan, San Jose, CA (US); David Brian Jackson, Dana Point, CA (US); Mark Luttrell, Cedar Park, TX (US)

(73) Assignee: SambaNova Systems, Inc., Palo Alto, CA (US)

( * ) Notice: Subject to any disclaimer, the term of this patent is extended or adjusted under 35 U.S.C. 154(b) by 0 days.

(21) Appl. No.: 16/260,548

(22) Filed: Jan. 29, 2019

(65) Prior Publication Data
US 2020/0241844 A1   Jul. 30, 2020

(51) Int. Cl.
*G06F 7/78*   (2006.01)
*G06F 5/08*   (2006.01)
*G06F 7/76*   (2006.01)
*G06F 12/02*   (2006.01)

(52) U.S. Cl.
CPC ............... *G06F 7/78* (2013.01); *G06F 5/08* (2013.01); *G06F 7/768* (2013.01); *G06F 12/0207* (2013.01)

(58) Field of Classification Search
CPC .......... G06F 7/78; G06F 5/08; G06F 12/0207; G06F 7/768
See application file for complete search history.

(56) References Cited

U.S. PATENT DOCUMENTS

| 4,769,790 A | 9/1988 | Yamashita |
| 5,560,029 A | 9/1996 | Papadopoulos et al. |
| 5,963,746 A | 10/1999 | Barker et al. |
| 6,105,119 A | 8/2000 | Kerr et al. |
| 6,119,181 A | 9/2000 | Vorbach et al. |
| 6,728,871 B1 | 4/2004 | Vorbach et al. |

(Continued)

FOREIGN PATENT DOCUMENTS

CN   1122026 A   5/1996

OTHER PUBLICATIONS

Paek et al., "Binary Acceleration Using Coarse-Grained Reconfigurable Architecture," ACM SIGARCH Computer Architecture News, vol. 38, No. 4, Sep. 2010, 7 pages.

(Continued)

*Primary Examiner* — Ajay Ojha
(74) *Attorney, Agent, or Firm* — Haynes Beffel & Wolfeld, LLP; Mark A. Haynes; Sikander Khan

(57) ABSTRACT

A configurable circuit configurable according to the data width of elements of a matrix is described that includes a memory array, logic to write a matrix to the memory array having elements with a data width which can be specified using configuration data, logic for a transpose read of the matrix as-written and logic for normal read of the matrix as-written. The memory array includes first and second read ports operable in parallel. Transpose read logic and normal read logic can be coupled to the first and second read ports, respectively, allowing transpose and normal read of a matrix simultaneously.

25 Claims, 15 Drawing Sheets

(56) References Cited

U.S. PATENT DOCUMENTS

| | | | |
|---|---|---|---|
| 7,797,258 | B1 | 9/2010 | Bowman et al. |
| 8,006,021 | B1 | 8/2011 | Li et al. |
| 8,045,546 | B1 | 10/2011 | Bao et al. |
| 8,261,042 | B2 | 9/2012 | Kanstein et al. |
| 9,201,899 | B2 | 12/2015 | Nishimura et al. |
| 9,411,532 | B2 | 8/2016 | Vorbach et al. |
| 9,569,214 | B2 | 2/2017 | Govindu et al. |
| 9,690,747 | B2 | 6/2017 | Vorbach et al. |
| 9,697,318 | B2 | 7/2017 | Hutton et al. |
| 9,875,105 | B2 | 1/2018 | Rozas et al. |
| 9,952,831 | B1 | 4/2018 | Ross et al. |
| 10,037,227 | B2 | 7/2018 | Therien et al. |
| 10,067,911 | B2 | 9/2018 | Gholaminejad et al. |
| 2004/0153608 | A1 | 8/2004 | Vorbach et al. |
| 2005/0108503 | A1 | 5/2005 | Sandon et al. |
| 2006/0190517 | A1* | 8/2006 | Guerrero ............... G06F 7/762 708/514 |
| 2009/0031089 | A1 | 1/2009 | Tuominen |
| 2009/0113169 | A1 | 4/2009 | Yang et al. |
| 2011/0264723 | A1* | 10/2011 | Yagain ............... G06F 17/147 708/402 |
| 2012/0126851 | A1 | 5/2012 | Kelem et al. |
| 2012/0131257 | A1 | 5/2012 | Rudosky et al. |
| 2014/0149480 | A1* | 5/2014 | Catanzaro ............... G06F 7/766 708/520 |
| 2014/0237227 | A1 | 8/2014 | Aizawa |
| 2014/0317628 | A1 | 10/2014 | Kim |
| 2016/0012012 | A1 | 1/2016 | Yen et al. |
| 2017/0083313 | A1 | 3/2017 | Sankaralingam et al. |
| 2017/0317678 | A1 | 11/2017 | Coole et al. |
| 2018/0121121 | A1 | 5/2018 | Mehra et al. |
| 2018/0157825 | A1 | 6/2018 | Eksten et al. |
| 2018/0189231 | A1 | 7/2018 | Fleming, Jr. et al. |
| 2018/0275193 | A1 | 9/2018 | Rouge et al. |
| 2018/0349098 | A1 | 12/2018 | Manohararajah |
| 2019/0042513 | A1 | 2/2019 | Fleming, Jr. et al. |
| 2019/0042924 | A1 | 2/2019 | Pasca et al. |
| 2019/0084296 | A1 | 3/2019 | Shaul et al. |
| 2019/0147323 | A1 | 5/2019 | Li et al. |
| 2019/0171604 | A1 | 6/2019 | Brewer |
| 2019/0205734 | A1 | 7/2019 | Guntoro |
| 2019/0303297 | A1 | 10/2019 | Fleming, Jr. et al. |

OTHER PUBLICATIONS

Vadivel et al., "Loop Overhead Reduction Techniques for Coarse Grained Reconfigurable Architectures," ResearchGate, Conference Paper, Aug. 2017, https://www.researchgate.net/publication/319416458, 9 pages.

Zhang, "Design of Coarse-Grained Reconfigurable Architecture for Digital Signal Processing," Implementation Aspects, Master of Science Thesis, Feb. 2009, 110 pages.

Koeplinger et al., "Spatial: A Language and Compiler for Application Accelerators," PLDI '18, Jun. 18-22, 2018, Association for Computng Machinery, 16 pages.

Nicol, "A Course Grain Reconfigurable Array (CGRA) for Statically Scheduled Data Flow Computing," Wave Computing, May 3, 2017, 9 pages.

Harris et al., "Architectures and Algorithms for User Customization of CNNs," ASP-DAC 2018, 32 pages.

De Sutter et al., "Coarse-Grained Reconfigurable Array Architectures," 2010 Handbook of Signal Processing Systems, 37 pages.

Nicol, "Wave Computing: A Dataflow Processing Chip for Training Deep Neural Networks," 2017, 25 pages.

Ando et al., "A Multithreaded CGRA for Convolutional Neural Network Processing," Scientific Research Publishing, Circuits and Systems, Jun. 2017, pp. 149-170.

Tanomoto et al., "A CGRA-based Approach for Accelerating Convolutional Neural Networks," 2015 IEEE 9th International Symposium on Embedded Multicore/Many-core Systems-on-Chip, 2015, pp. 73-80.

Jafri et al., "NeuroCGRA: A CGRAs with Support for Neural Networks," 2014 International Conference on High Performance Computing & Simulation (HPCS), 8 pages.

Li, et al., "CATERPILLAR: Coarse Grain Reconfigurable Architecture for Accelerating the Training of Deep Neural Networks," arXiv: 1706.00517v2 [cs.DC], Jun. 8, 2017, 10 pages.

Wijtvliet, Course Syllabus for "Accelerators and Coarse Grained Reconfigurable Architectures," Advanced School for Computing and Imaging, 2017, 2 pages.

Hartenstein, "Coarse Grain Reconfigurable Architectures," IEEE, 2001, 6 pages.

Wang, et al., "Reconfigurable Hardware Accelerators: Opportunities, Trends and Challenges," Cornell University, Dec. 13, 2017, 25 pages.

Vranjkovic et al., "Coarse-Grained Reconfigurable Hardware Accelerator of Machine Learning Classifiers," IWSSIP 2016, The 23rd International Conference on Systems, Signals and Image Processing, May 23-25, 2016, Bratislava, Slovakia, 5 pages.

Wijtvliet et al., "Coarse Grained Reconfigurable Architectures in the Past 25 Years: Overview and Classification," IEEE 2016, pp. 235-244.

Fiolhais et al., "Overlay Architectures for Space Applications," SpacE FPGA Users Workshop, Apr. 9-11, 2018, pp. 1-20.

Prabhakar et al., "Plasticine: A Reconfigurable Architecture for Parallel Patterns," ISCA, Jun. 24-28, 2017, 14 pages.

"Activation Function," Downloaded from Wikipedia on Aug. 16, 2019, 3 pages.

AMBA AXI and ACE Protocol Specification, ARM, as early as Jan 2003, 440 pages.

Basterretxea et al., "Approximation of sigmoid function and the derivative for hardware implementation of artificial neurons," IEE Proceedings—Circuits, Devices and Systems, vol. 151, Issue 1, Feb. 5, 2004, 7 pages.

Eppler et al. ,"High speed neural network chip for trigger purposes in high energy physics," IEEE, Proc. of the conference on design, automation and test in Europe, Feb. 1998, 8 pages.

Gomar et al. "Precise digital implementations of hyperbolic tanh and sigmoid function," 2016 50th Asilomar Conference on Signals, Systems and Computers, Nov. 6-9, 2016, 4 pages.

Iannucci, "Toward a dataflow/von Neumann hybrid architecture," ISCA '88 Proc. of the 15th Annual ISCA, May 30-Jun. 2, 1988, 10 pages.

Lin et al., "A Digital Circuit Design of Hyperbolic Tangent Sigmoid Function for Neural Networks," 2018 IEEE Int'l Symp. on Circuits and Systems, May 18-21, 2018, 4 pages.

Prabhakar et al., "Plasticine: A Reconfigurable Architecture for Parallel Patterns," ISCA 2017, Jun. 24-28, 2017, 14 pages.

Turkson et al. "Artificial neural network applications in the calibration of spark-ignition engines: An overview," Engineering Science and Technology, an International Journal, vol. 19, Issue 3, Sep. 2016, 1346-1359.

U.S. Appl. No. 16/197,826, filed Nov. 21, 2018, entitled "Configuration Load of a Reconfigurable Data Processor," 59 Pages.

U.S. Appl. No. 16/239,252—Office Action dated Aug. 7, 20019, 8 pages.

U.S. Appl. No. 16/239,252—Response to Final Office Action dated Jan. 8, 2020 filed Jan. 24, 2020, 14 pages.

U.S. Appl. No. 16/239,252—Notice of Allowance dated Feb. 12, 2020, 10 pages.

PCT/US2019/062287—International Search Report and Written Opinion dated Feb. 5, 2020, 18 pages.

Prabhakar et al., "Plasticine: A reconfigurable architecture for parallel patterns." In 2017 ACM/IEEE 44th Annual International Symposium on Computer Architecture (ISCA), pp. 389-402. IEEE, 2017.

PCT/US2019/062289—International Search Report and Written Opinion dated Feb. 28, 2020, 14 pages.

PCT/US2020/014652—International Search Report and Written Opinion dated May 26, 2020, 9 pages.

* cited by examiner

MATRIX NORMAL/TRANSPOSE READ AND A RECONFIGURABLE DATA PROCESSOR INCLUDING SAME

BACKGROUND

Technological Field

The present technology relates to normal read, and transpose matrix read, operations in support of matrix-based computation, and to reconfigurable architectures utilizing the same, which can be particularly applied to coarse-grain reconfigurable architectures.

Description of Related Art

Reconfigurable processors, including field programmable gate arrays FPGAs, can be configured to implement a variety of functions more efficiently or faster than might be achieved using a general purpose processor executing a computer program. So-called coarse-grain reconfigurable architectures (e.g. CGRAs) are being developed in which the configurable units in the array are more complex than used in typical, more fine-grained FPGAs, and may enable faster or more efficient execution of various classes of functions. For example, CGRAs have been proposed that can enable implementation of energy-efficient accelerators for machine learning and artificial intelligence workloads. See, Prabhakar, et al., "Plasticine: A Reconfigurable Architecture for Parallel Patterns," ISCA '17, Jun. 24-28, 2017, Toronto, ON, Canada.

Machine learning systems can involve complex matrix computations, where the matrices can be very large. In some matrix computations, the elements of a matrix are read from memory in row major format, so output vectors include elements of a row of the matrix. In other matrix computations, the elements of a matrix are read from the memory in column major format, so output vectors include elements of a column of the matrix. When storing a matrix, a choice can be made to use either format. However, some procedures to read out in a column major format vectors of a matrix stored in row major format, and vice versa, requiring several read steps which can be time consuming. This problem can be exacerbated in configurable processors where the data types used for elements of the matrix, and therefore the number of bits per element, can vary from one configuration to another.

In order to improve operating efficiency, a means of efficiently accessing matrices in a configurable processor, and in other settings, is needed.

SUMMARY

A technology is described suitable for use in a reconfigurable processor, and in other settings, providing for efficient transpose and normal reads of matrices.

In one aspect, a configurable circuit, configurable according to the data width of elements of the matrix, is described that includes a memory array, logic to write a matrix to the memory array having elements with a data width which can be specified using configuration data, logic for a transpose read of the matrix as-written and logic for normal read of the matrix as-written. In another aspect, a reconfigurable processor is described in which one (or more) of the configurable units of the reconfigurable processor includes a configurable circuit supporting normal and transpose read. In another aspect, the technology provides logic supporting high throughput transpose read of matrices stored in memory.

In some embodiments described herein, the memory array includes first and second read ports operable in parallel. Transpose read logic and normal read logic can be coupled to the first and second read ports, respectively, allowing transpose and normal reads of a matrix simultaneously.

A circuit is described in which the memory circuit includes a plurality of slots readable in parallel on different rows. The slots have a slot width which is a multiple M of the data width of elements of matrices to be processed. For example, the slot width can be at least 2 times the data width of the maximum data width of elements of matrices to be processed (in this case, M=2 for the maximum data width). Write logic associated with the transpose read operation organizes sets of the number M rows of the matrix into a plurality of rows of atoms of M by M elements, where an "atom" is a subset of the input matrix configured according to data width examples of which are described below. The atoms in a row of atoms are stored in respective slots in the plurality of slots, and rotated in position in the row of atoms relative to the input matrix as a function of a row number of the row of atoms. Transpose read logic includes logic to select atoms in the slots according to the column of the input matrix to be read, and store the selected atoms in a reshape circuit. Logic in the reshape circuit transposes the atoms in the selected atoms to form the output vectors of the transpose read. In some embodiments, the reshape circuit includes a FIFO that is operable using double buffering, providing a throughput of output vectors per clock cycle, that matches the memory access rate, and preferably matches the bus rate of a bus to which the output vectors are delivered.

Other aspects and advantages of the technology described herein can be seen on review of the drawings, the detailed description and the claims, which follow.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows.

Figure 1:
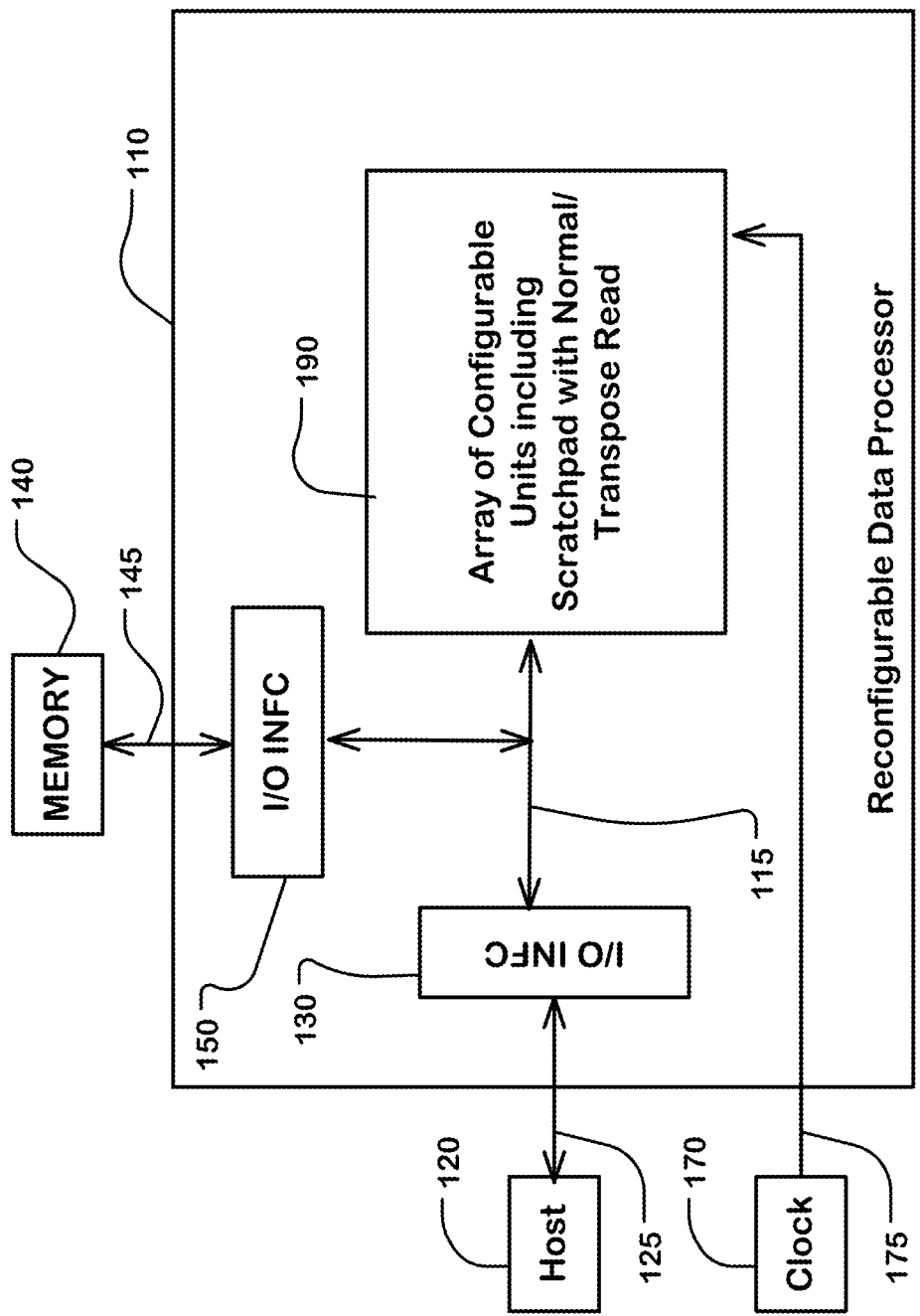
FIG. 1 is a system diagram illustrating a system including a host, a memory, and a reconfigurable data processor.

FIG. 1 is a system diagram illustrating a system including a host 120, a memory 140, and a reconfigurable data processor 110. As shown in the example of FIG. 1, the reconfigurable data processor 110 includes an array 190 of configurable units, including one or more configurable units that comprise memory circuits usable for, for example, a scratchpad memory where the memory circuits support normal and transpose matrix read operations configurable according to data type (or data width for selected data types). The processor 110 includes an external I/O interface 130 connected to the host 120 by lines 125, which can comprise I/O pins or the equivalent for an integrated circuit including the processor 110. The processor 110 includes an external I/O interface 150 connected to the memory 140 by lines 145, which can comprise I/O pins or the equivalent for an integrated circuit including the processor 110. The I/O interfaces 130, 150 connect via a bus system 115 to the array 190 of configurable units. The bus system 115 may have a bus width of one vector of data, which for contextual example can be 256 bits (32 bytes), or any number selected for a given environment of use.

To configure configurable units in the array 190 of configurable units with a configuration file, the host 120 can send a configuration file to the memory 140 via the interface 130, the bus system 115, and the interface 150 in the reconfigurable processor 110. The configuration file can be loaded in many ways, as suits a particular architecture, including in data paths outside the reconfigurable processor 110. The configuration file can be retrieved from the memory 140 via the memory interface 150. The configuration file can then be sent to configurable units in the array 190 of configurable units in the reconfigurable processor 110. In embodiments described herein, the configuration file can include configuration data for configuration of memory circuits supporting normal and transpose matrix read operations, including configuration parameters specifying a data width of elements of a matrix to be stored in memory using one of a plurality of data types having different data widths, such as 8 bits per element, 16 bits per element, 32 bits per element, and so on. See, commonly owned U.S. patent application entitled Configuration Load of a Reconfigurable Data Processor, application Ser. No. 16/197,826, filed: 21 Nov. 2018, which is hereby incorporated by reference as if fully set forth herein.

An external clock generator 170 or other clock signal sources can provide a clock signal 175 or clock signals to elements in the reconfigurable data processor 110, including the array 190 of configurable units, and the bus system 115, and the external data I/O interfaces. The bus system can operate at a bus rate of one or more vectors per bus cycle, using the clock signal. In embodiments of the memory circuits supporting normal and transpose matrix read operations, the transpose read and normal read operations are executable at a memory access rate that is equal to the bus rate of one or more vectors per cycle. Also, in embodiments described herein, the transpose read and normal read operations can operate in parallel in the same memory to provide both row major and column major vectors in parallel at the bus rate on different ports of the memory.

In general, a procedure is provided in which matrix data is written in memory in a form shifted on "atom" basis into a memory, where an atom is a subset of the input matrix configured according to data width as explained below, at the memory clock speed. For a normal read, the data can be read out in the shifted form as stored (e.g., row major) and shifted back to the original state for output at the memory clock speed. For transpose read, the data can also be read out in the shifted form using diagonal addressing on an atom basis, to a reshape circuit at the memory clock speed. The reshape circuit includes a multiplexing structure to pull the correct data from the atoms and output the data in transpose form (e.g. column major). The depth of the reshape circuit is dependent on the depth of the atoms, and thus on data widths supported. Configuration data can be applied to configure the circuit according to data type or data width.

The memory circuit can comprise a memory array and a reshape circuit with supporting logic, to store a matrix that can be read in two different formats with no throughput loss, and without having to duplicate the data or read it serially. Also, the memory circuit can support a plurality of different data types with different data widths (e.g., 32, 16, and 8 bits) to provide flexibility.

Figure 2A:
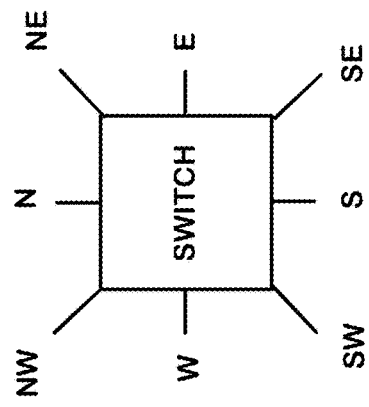
FIG. 2A illustrates an example switch unit connecting elements in an array level network.
Figure 2:
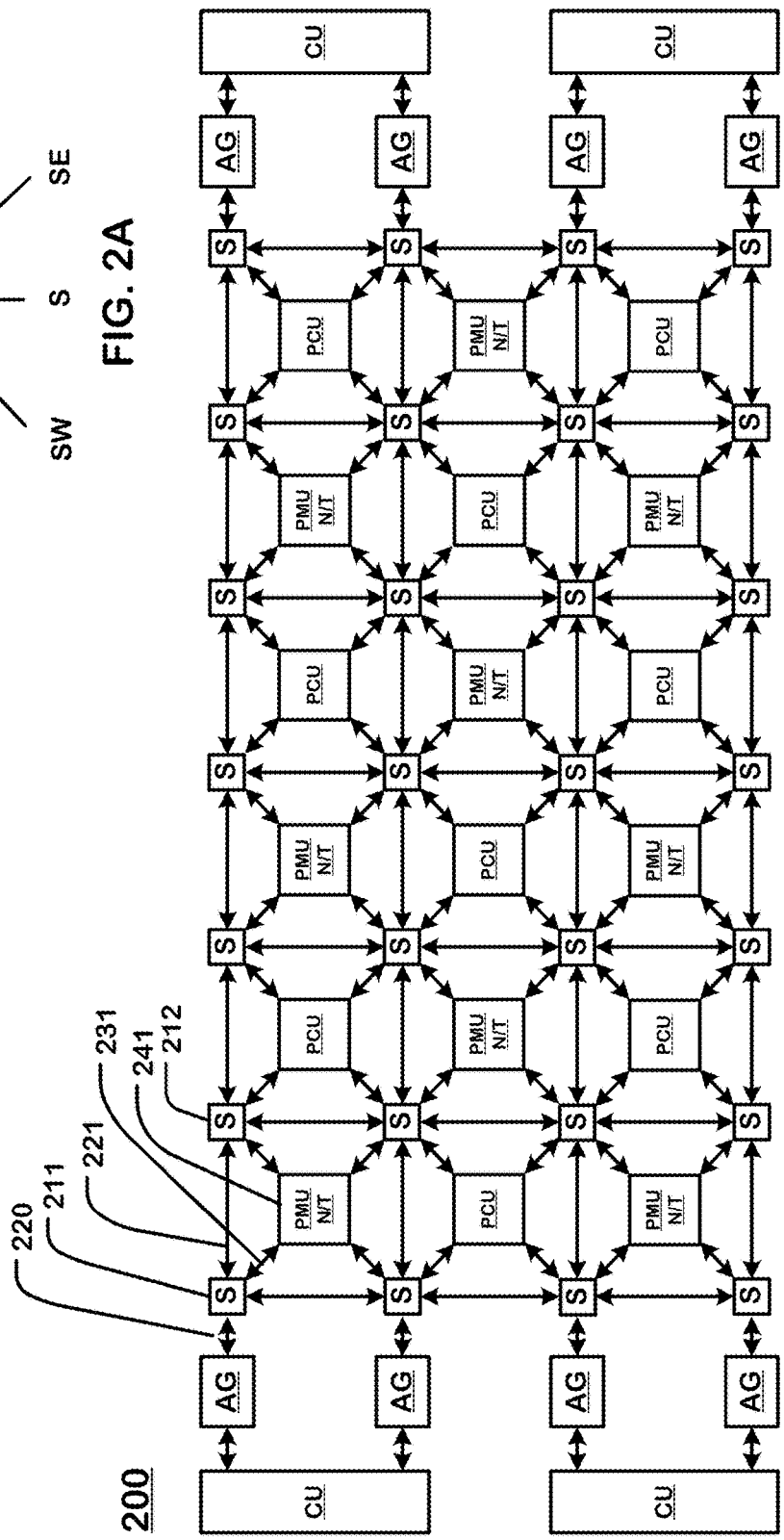
FIG. 2 is a simplified diagram of a tile and an array level network usable in the configuration of FIG. 1, where the configurable units in the array are nodes on the array level network.

FIG. 2 is a simplified diagram of a tile and an array level network usable in a reconfigurable processor, where the configurable units in the array are nodes on a bus system including an array level network, which is connected to a top level network (not shown) for communication with other elements of the system.

In this example, the array of configurable units 200 includes a plurality of types of configurable units. The types of configurable units in this example, include Pattern Compute Units (PCU), Pattern Memory Units (PMU), switch units (S), and Address Generation and Coalescing Units (each including two address generators AG and a shared CU). For an example of functions of these types of configurable units, see, Prabhakar et al., "Plasticine: A Reconfigurable Architecture For Parallel Patterns", ISCA '17, Jun. 24-28, 2017, Toronto, ON, Canada, which is incorporated by reference as if fully set forth herein. As described herein, one or more of the PMU N/T units can comprise circuits configurable according to data width of data types to execute normal and transpose reads of a matrix in parallel, as indicated by the labels in the diagram, at the bus rate for the vector bus.

Each of these configurable units can contain a configuration store comprising a set of registers or flip-flops that represent either the setup or the sequence to run a program, and can include the number of nested loops, the limits of each loop iterator, the instructions to be executed for each stage, the source of the operands and matrices, the data types or data widths of elements of matrices, and the network parameters for the input and output interfaces.

Additionally, each of these configurable units can contain a configuration store comprising a set of registers or flip-flops that store status usable to track progress in nested loops or otherwise. A configuration file contains a bit-stream representing the initial configuration, or starting state, of each of the components that execute the program. This bit-stream is referred to as a bit-file. Program load is the process of setting up the configuration stores in the array of configurable units based on the contents of the bit file to allow all the components to execute a program (i.e., a machine). Program Load may also require the load of PMU memories.

The array level network includes links interconnecting configurable units in the array. The links in the array level network include one or more and, in this case, three, kinds of physical buses: a vector bus (e.g. sixteen to thirty-two bytes), a word-level scalar bus (e.g. one to four bytes), and a multiple bit-level control bus. For instance, interconnect 221 between switch units 211 and 212 includes a vector bus interconnect, a scalar bus interconnect, and a control bus interconnect. Likewise, interconnects 231 between switch unit 211 and the configurable unit 241 include a vector bus interconnect, a scalar bus interconnect, and a control bus interconnect. The configurable unit 241 in this example is a PMU unit with support for normal and transpose reads (PMU N/T) as described herein.

The three kinds of physical buses differ in the granularity of data being transferred. In one embodiment, the vector bus can carry a vector that includes 32-Bytes (=256 bits) of data as its payload at a data rate of one vector per bus cycle. The scalar bus can have a 32-bit payload, and carry scalar operands or control information at a data rate of one scalar payload per bus cycle. The control bus can carry control handshakes such as tokens and other signals. The vector and scalar buses can be packet switched in some embodiments, including headers that indicate a destination of each packet and other information such as sequence numbers that can be used to reassemble a file when the packets are received out of order. Each packet header can contain a destination identifier that identifies the geographical coordinates of the destination switch unit (e.g. the row and column in the array), and an interface identifier that identifies the interface on the destination switch (e.g. North, South, East, West, etc.) used to reach the destination unit. The control network can be circuit switched based on timing circuits in the device, for example.

In one example, a vector of data of 256 bits is transmitted on the vector bus that provides the vector inputs to a configurable unit. The vector bus can include 256 payload lines, and a set of header lines. The header can include a sequence ID for each chunk, which can includes:
  A bit to indicate if the chunk is scratchpad memory or configuration store data.
  Bits that form a chunk number.
  Bits that indicate a column identifier.
  Bits that indicate a row identifier.
  Bits that indicate a component identifier.

FIG. 2A illustrates an example switch unit connecting elements in an array level network. As shown in the example of FIG. 2A, a switch unit can have 8 interfaces. The North, South, East and West interfaces of a switch unit are used for connections between switch units. The Northeast, Southeast, Northwest and Southwest interfaces of a switch unit are each used to make connections to PCU or PMU instances. A set of two switch units in each tile quadrant have connections to an Address Generation and Coalescing Unit (AGCU) that include multiple address generation (AG) units and a coalescing unit (CU) connected to the multiple address generation units. The coalescing unit (CU) arbitrates between the AGs and processes memory requests. Each of the eight interfaces of a switch unit can include a vector interface, a scalar interface, and a control interface to communicate with the vector network, the scalar network, and the control network.

During execution of a machine after configuration, data can be sent via one or more unit switches and one or more links between the unit switches to the configurable units using the vector bus and vector interface(s) of the one or more switch units on the array level network.

Figure 3:
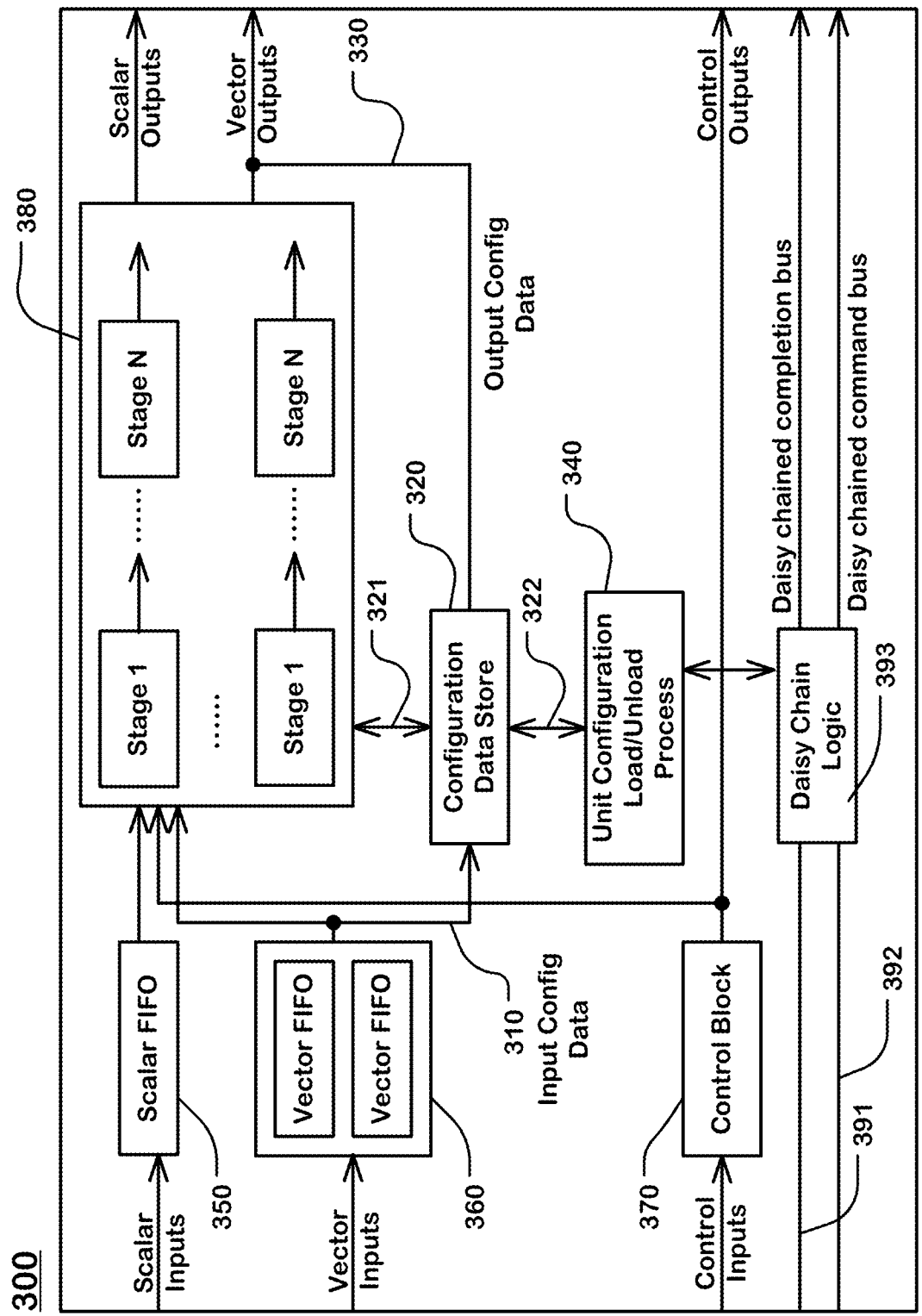
FIG. 3 is a block diagram illustrating an example configurable unit.

FIG. 3 is a block diagram illustrating an example configurable unit 300, such as a Pattern Compute Unit (PCU). Configurable units in the array of configurable units include configuration data stores 320 (e.g. serial chains) to store unit files comprising a plurality of chunks (or sub-files of other sizes) of configuration data particular to the corresponding configurable units. Configurable units in the array of configurable units each include unit configuration load logic 340 connected to the configuration data store 320 via line 322, to execute a unit configuration load process. The unit configuration load process includes receiving via the bus system (e.g. the vector inputs), chunks of a unit file particular to the configurable unit, and loading the received chunks into the configuration data store 320 of the configurable unit.

The configuration data stores in configurable units in the plurality of configurable units in this example comprise serial chains of latches, where the latches store bits that control configuration of the resources in the configurable unit. A serial chain in a configuration data store can include a shift register chain for configuration data and a second shift register chain for state information and counter values connected in series.

A configurable unit can interface with the scalar, vector, and control buses using three corresponding sets of inputs and outputs (TO): scalar inputs/outputs, vector inputs/outputs, and control inputs/outputs. Scalar IOs can be used to communicate single words of data. Vector IOs can be used to communicate vectors of data, in cases such as receiving configuration data in a unit configuration load process, and transmitting and receiving data during operation after configuration across a long pipeline between multiple PCUs. Control IOs can be used to communicate control signals such as the start or end of execution of a configurable unit. Control inputs are received by control block 370, and control outputs are provided by the control block 370.

Each vector input can be buffered using a vector FIFO in a vector FIFO block 360 which can include one or more vector FIFOs. Each scalar input can be buffered using a scalar FIFO 350. Using input FIFOs decouples timing between data producers and consumers, and simplifies inter-configurable-unit control logic by making it robust to input delay mismatches.

Input configuration data 310 can be provided to a vector FIFO as vector inputs, and then be transferred to the configuration data store 320. Output configuration data 330 can be unloaded from the configuration data store 320 using the vector outputs.

The CGRA uses a daisy chained completion bus to indicate when a load/unload command has been completed. An AGCU as shown in FIG. 2, in one example, can include logic to transmit program load and unload commands to configurable units in the array of configurable units over a daisy-chained command bus. As shown in the example of FIG. 3, a daisy chained completion bus 391 and a daisy chained command bus 392 are connected to daisy chain logic 393, which communicates with the unit configuration load logic 340. The daisy chain logic 393 can include load complete status logic, as described below. The daisy chained completion bus is further described below. Other topologies for the command and completion buses are clearly possible but not described here.

A configurable unit includes multiple reconfigurable datapaths in block 380. A datapath in a configurable unit can be organized as a multi-stage (Stage 1 . . . Stage N), reconfigurable SIMD (Single Instruction, Multiple Data) pipe line. The chunks of data pushed into the configuration serial chain in a configurable unit include configuration data for each stage of each datapath in the configurable unit. The configuration serial chain in the configuration data store 320 is connected to the multiple datapaths in block 380 via lines 321.

A Pattern Memory Unit (e.g. PMU) can contain scratchpad memory coupled with a reconfigurable scalar datapath intended for address calculation, along with the bus interfaces used in the PCU. PMUs can be used to distribute on-chip memory throughout the array of reconfigurable units. In one embodiment, address calculation within the memory in the PMUs is performed on the PMU datapath, while the core computation is performed within the PCU.

Figure 4:
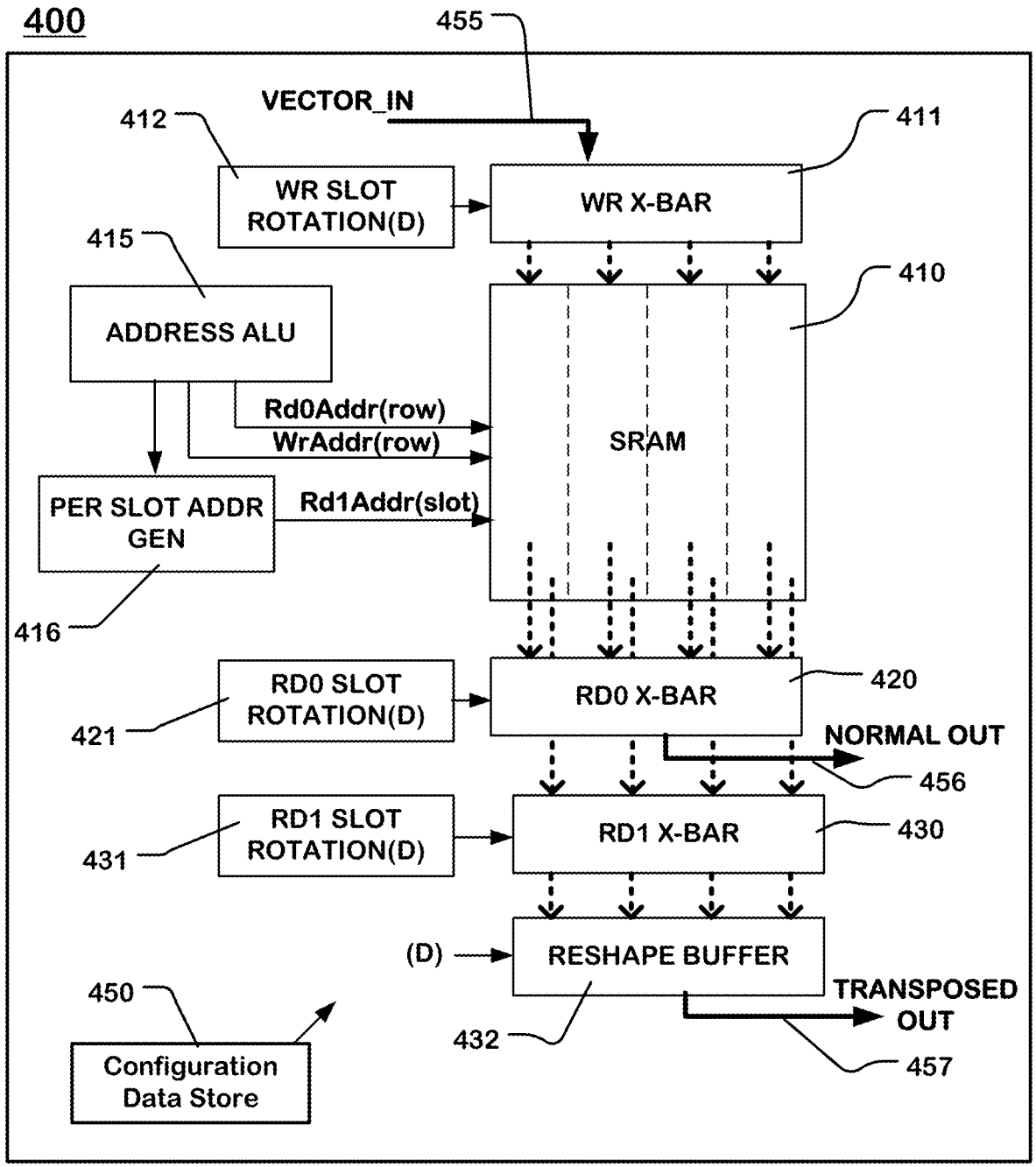
FIG. 4 is a block diagram illustrating an example of a configurable circuit for transpose and normal read of a matrix which can be part of a configurable unit in a reconfigurable data processor.

FIG. 4 illustrates a configurable circuit 400 which can be part of a PMU (e.g. 241) as described above, and in such embodiments can include components of the configurable unit of FIG. 3, used for loading and unloading configuration files, and for interfacing with the array level network. Also the configurable circuit can be used with other types of configurable units of a reconfigurable processor, and in other systems in which normal and transpose read of matrices is useful.

The configurable circuit 400 illustrated in FIG. 4 includes a memory array 410. The memory array 410 can comprise dual port random access memory, such as dual port SRAM, which supports parallel normal and transpose read operations of a matrix stored in the memory array as described below. In some embodiments, a single port random access memory can be utilized. A dual port random access memory can be implemented using a banked structure, in which the array is divided into a plurality of banks operable for read and write access in parallel with supporting multiplexing and arbitrating logic to avoid collisions. Also, a dual port random access memory can be implemented using "true" dual port memory which allows simultaneous read access on each of the dual ports throughout the array.

The memory array 410 is logically or physically divided into a plurality of slots (represented by vertical dashed lines). A row of memory cells in the array 410 traverses the plurality of slots. A memory access can operate on rows (across the plurality of slots) or on slots depending on the addressing scheme applied as discussed below. For example, a row of memory cells accessible in parallel can have a width of 256 memory cells storing 32 bytes of data, while a slot of memory cells (within a row) accessible in parallel can have a width of 64 memory cells storing 8 bytes of data. The configurable circuit 400 is configurable to perform matrix operations on a plurality of different data types having different data widths, where the slot width can be a multiple of the data widths.

The configurable circuit 400 includes an address generator 415, which can be implemented using an arithmetic logic unit ALU, or a program controlled counter or other logic circuitry. In some embodiments, the address generator 415 can correspond with a staged processor unit like that in block 380 of FIG. 3. The address generator 415 for this embodiment produces row addresses WrAddr(row) to write a matrix into the array 410 on a row-by-row basis. Also, the address generator 415 for this embodiment produces row addresses Rd0Addr(row) to read a matrix out of the array 410 on a row-by-row basis. In this example circuit, the Rd0Addr addresses are used for reads on the first port of the memory array. The address generator 415 is logically coupled in this example to a per-slot address generator 416, which can generate a plurality of slot row addresses Rd1Addr(slot), which can be different rows for each slot, to support matrix read and write operations as described herein. In this example circuit, the Rd1Addr addresses are used for reads on the second port of the memory array.

The configurable circuit 400 includes logic to write a matrix to the memory array 410 having a data width having a number D bits of data, where the number D can be provided by configuration data. The configuration data can be provided from a configuration data store 450 accessible by or included in the configurable circuit. The configuration data store 450 can store data from a configuration file loaded as discussed above in connection with FIG. 3.

In the example illustrated in FIG. 4, the write logic includes a write crossbar 411 which is connected to a vector input 455 of the configurable circuit 400. The write crossbar 411 is controlled by write slot rotation logic 412. The write logic also includes coordinating address generation routines in the address generator 415 and per-slot address generator 416 to write a matrix into the array using a shifted version of a selected one of a row major organization and a column major organization. In general, these components provide means for organizing sets of M rows of a matrix into a plurality of slots having a slot width of M elements in the memory into a plurality of rows of atoms of M by M elements, atoms in a row of atoms being stored in respective slots in the memory, and rotated in position in the row of atoms relative to an input matrix as a function of a row number of the row of atoms in the plurality of rows of atoms.

For the purposes of this description, the operation and logic are described assuming a row major organization of the write. It will be understood that the technology can be applied using a column major organization of the write. Embodiments of the write logic are described in more detail with reference to FIGS. 5 and 6.

The configurable circuit also includes transpose read logic configured according to the data width D to output vectors of a transpose read of the matrix to read out the matrix in a column major form, and normal read logic configured according to the data width to output vectors of a normal read of the matrix to read out the matrix in a row major form. As noted above, the memory array 410 includes first and second ports. The normal read logic is coupled to the first port (Port 0) and the transpose read logic is coupled to the second port (Port 1), in this example.

The normal read logic includes a read crossbar 420 or other rotation logic operably coupled to the memory array 410 on port 0 which is connected to a vector output 456 of the configurable circuit 400. The read crossbar 420 is controlled by read slot rotation logic 421. The normal read logic also includes coordinating address generation routines in the address generator 415 to read a matrix from the array in the shifted version and undo the shift to recover the order of the original matrix. The normal read logic and examples thereof are described in more detail below with reference to FIGS. 15-17.

The transpose read logic includes read crossbar 430 or other rotation logic operably coupled to the memory array 410 on port 1, which is connected to a vector output 457 of the configurable circuit 400. The read crossbar 430 is controlled by read slot rotation logic 431. The transpose read logic also includes coordinating address generation routines in the address generator 415 and in the per-slot address generator 416, to read selected atoms from the array according to the column to be read, and undo the shift. Data from the read crossbar 430 is applied on an "atom" basis to a reshape circuit 432, in which the row major as-written matrix can be output on a column major basis. In general, these components provide means for selecting atoms in the slots to be read, and transposing the selected atoms to form output vectors of the transpose read of the matrix. The transpose read logic and examples thereof are described in more detail below with reference to FIGS. 7-14.

As noted above, the normal read logic and the transpose read logic can be operated in parallel in embodiments with dual port memory, performing both read operations simultaneously on the same or on different matrices stored in the memory array 410.

Figure 5:
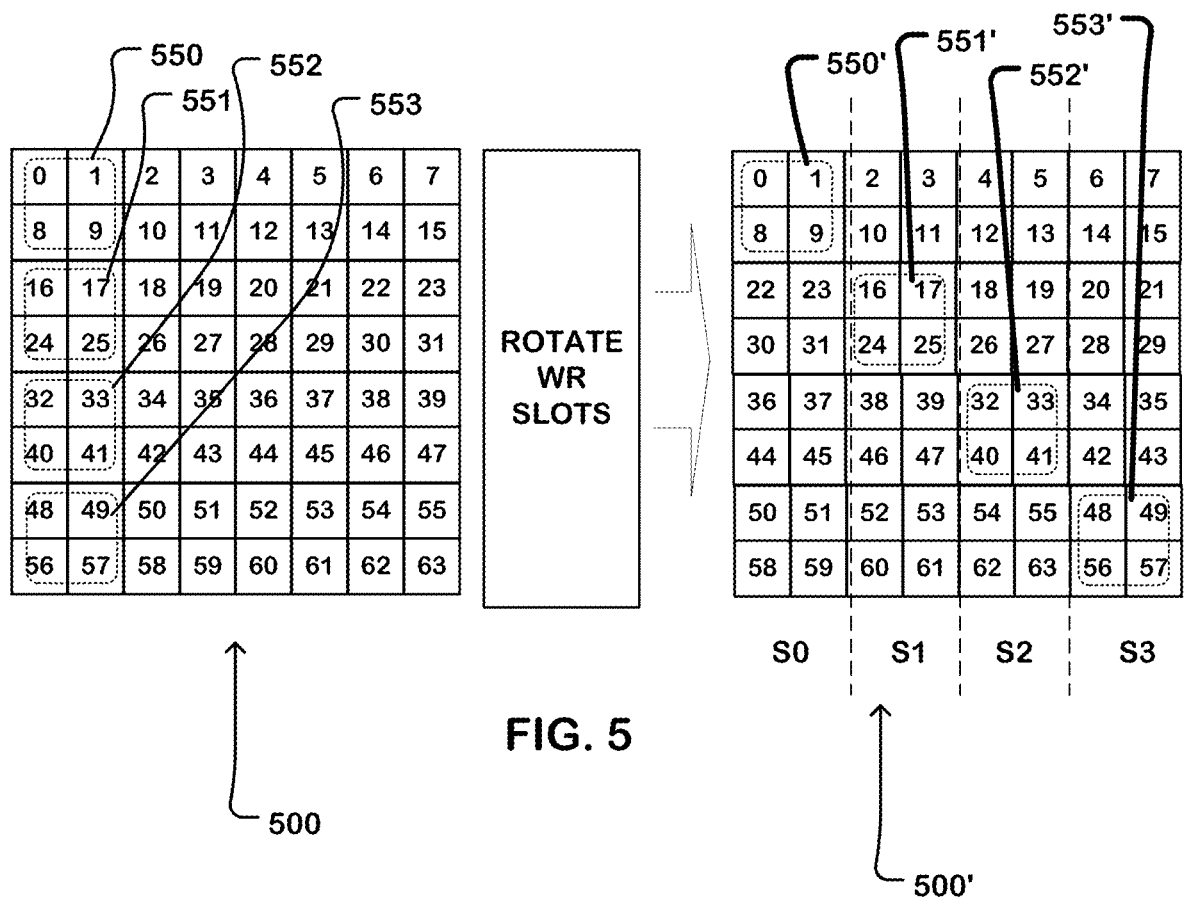
FIG. 5 illustrates an input matrix and a matrix organized in support of a configurable memory circuit as described herein.

FIG. 5 shows an example of a matrix write operation which can be executed by the write logic shown in FIG. 4. The input matrix 500 in this example is an 8×8 matrix having elements 0 to 63 organized in a row major form. The input matrix 500 is written in an as-written form 500' to the memory array. For the purposes of the example in FIG. 5, the memory array includes 4 slots S0 to S3, and each slot has a slot width that is a multiple M times the data width of the elements of the matrix, where M in this example is 2. Given the parameter M which is a function of the data width of the elements of the matrix, and the slot width of the memory circuit, the matrix can be logically organized into "atoms", which are defined herein as sub-matrices of the input matrix having M rows and M columns of elements of the matrix, such that each atom can be stored within a single slot of the array. As can be seen, the first 2 columns of the input matrix 500 have eight elements each, and one column of four 2×2 atoms 550, 551, 552, and 553. The 8×8 input matrix 500 therefore includes 16 atoms, arranged in four atom rows and four atom columns.

The write logic organizes sets of M rows of the input matrix into corresponding rows of atoms, where each row of atoms includes atoms stored in respective slots in the plurality of slots of the array. The atoms in each row of atoms are rotated in position within the row of atoms in a circular fashion (e.g. clockwise) relative to the input matrix as a function of an atom row number in the plurality of rows of atoms. Thus, in the first row of atoms, there is no rotation. Thus atom 550' as stored in the memory is the same position as atom 550 of the input matrix. In the second row of atoms, there is a rotation of one slot. Thus atom 551' as stored in the memory is shifted by one slot from atom 551 of the input matrix. In the third row of atoms, there is a rotation of 2 slots. Thus atom 552' as stored in the memory is shifted by 2 slots from atom 552 of the input matrix. In the fourth row of atoms, there is a rotation of 3 slots. Thus atom 553' as stored in the memory is shifted by 3 slots from atom 553 of the input matrix.

Figure 6:
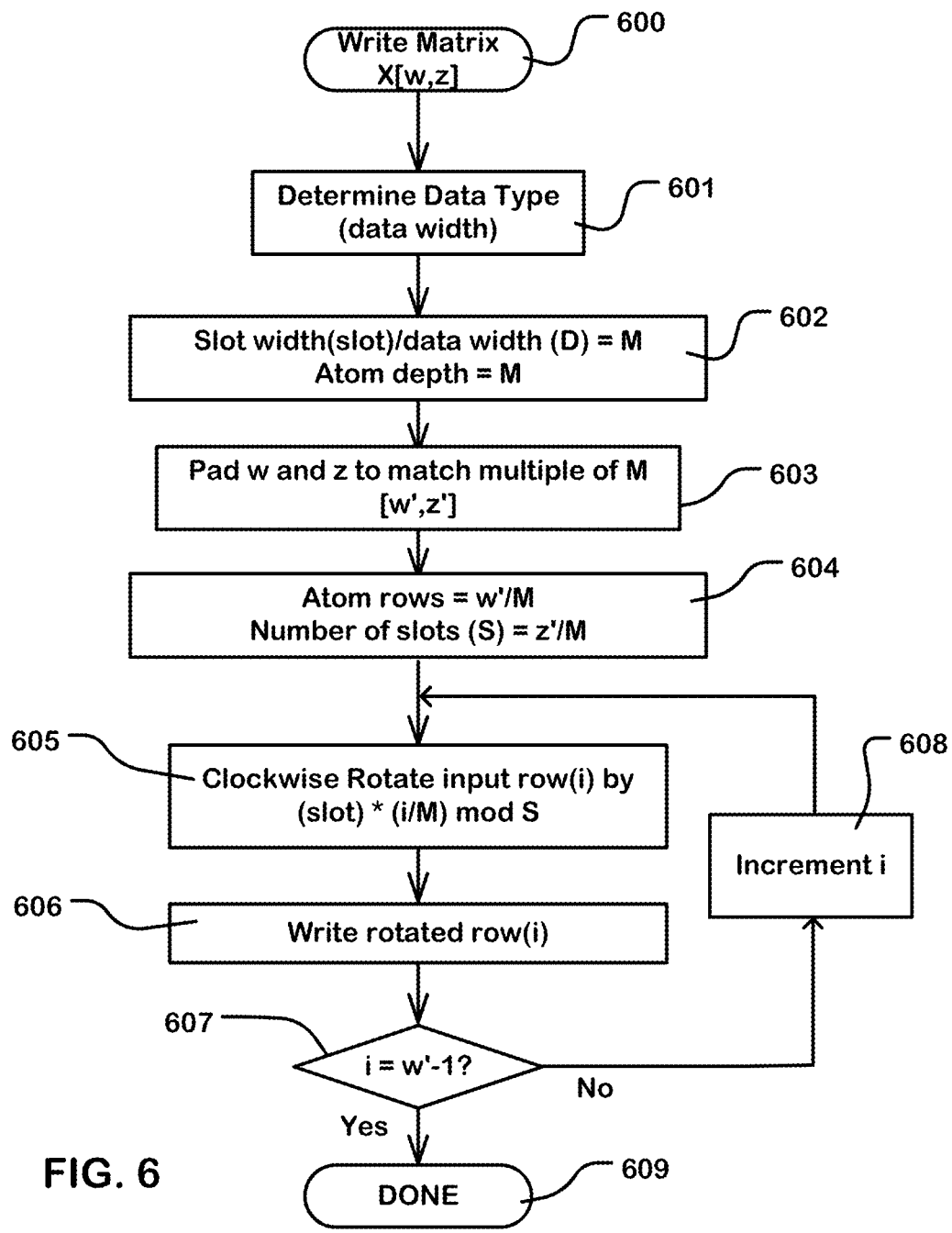
FIG. 6 is a flowchart illustrating logic for writing a matrix in a memory circuit supporting normal and transpose reads as described herein.

FIG. 6 is a flowchart illustrating an example of write logic in a configurable circuit like that of FIG. 4. The flowchart shows functions for writing a matrix X[w,z] with w rows and z columns (block 600). The logic includes determining a data type of the elements of the matrix, or determining another indicator of the data width (D) (block 601). Also, parameters of the atoms are determined by dividing the slot width (slot) in bits or bytes by the data width (D) in bits or bytes of the elements of the matrix to determine the parameter M, which is equal to the number of rows and columns of an atom (block 602). In some embodiments, the parameter M can be provided by the configuration logic as the indicator of data width. If needed, a step can be executed to pad the number of rows w and the number of columns z of the input matrix so that the padded dimensions of the as-written matrix are w' and z', both of which are integer multiples of M, and may be the same or different numbers (block 603). As a result, the write operation will write a number w'/M of atom rows and a number of slots S equal to z'/M (block 604). The write crossbar or other routing logic in coordination with the address generator traverses the rows of the input matrix, row(i) for i going from 0 to w'-1, and rotates (e.g. clockwise) the input row row(i) by $$((\text{slot})*(i/M) \bmod S),$$

where "slot" is equal to the slot width and "(i/M)" is an integer quotient equal to the atom row number including row(i), and S is the number of slots (block 605). Next, row(i) as rotated is written to the memory (block 606). If the index "i" has not reached w'-1 (block 607), then the index "i" is incremented (block 608), and the loop returns to block 605. If the index has reached the maximum value at block 607, then the write is completed (block 609).

Figure 7:
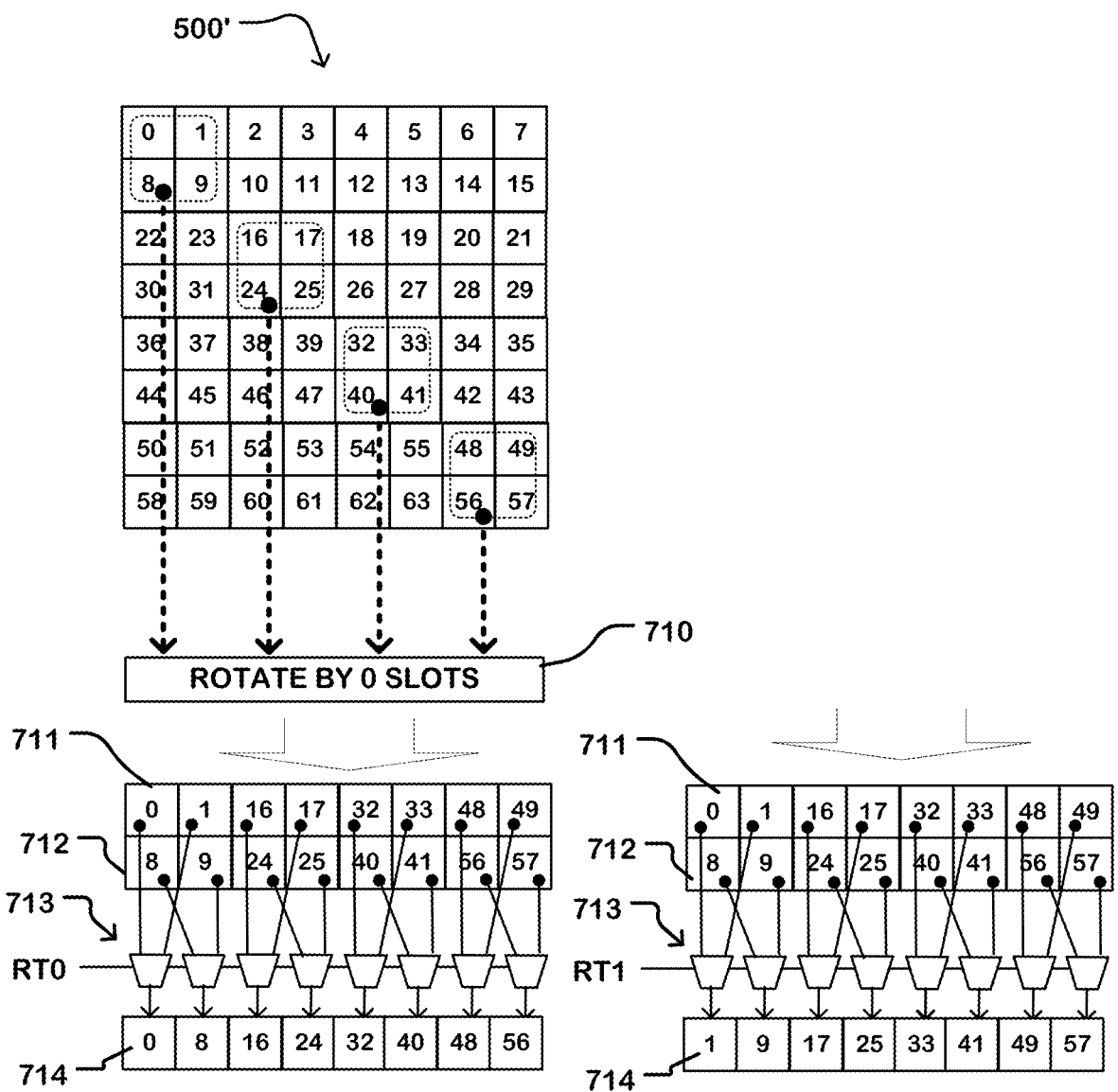
FIGS. 7 through 10 illustrate a transpose read operation for a memory circuit as described herein, having an atom size of 2×2.

FIGS. 7 through 10 illustrate the procedure for a transpose read of the matrix 500, using as-written matrix 500' shown in FIG. 5. FIG. 7 shows the procedure for reading the first two columns of the matrix 500. In order to execute the transpose reads, the atoms in the as-written matrix 500' are read on a slot-by-slot basis, where the slot row address in each slot accesses a different atom in order to align the contents of the columns to be read for output. The slot row address for each slot can be computed based on the column number of the matrix to be read, and the dimensions of the atoms which, as discussed above, are determined by the data width and the slot width.

As illustrated in FIG. 7, to read the first two columns of the as-written matrix 500' slot row addresses are generated in sequence to access the first atom in the first slot S0, the second atom in the second slot S1, the third atom in the third slot S2, and the fourth atom in the fourth slot S3. As a result, an output vector is applied to rotation logic 710 such as a crossbar, and from the rotation logic to reshape circuits including buffers 711, 712 and a multiplexer tree 713. As illustrated in FIG. 7, atoms are loaded into the buffers 711, 712 that include a set of atoms including the contents of the first and second columns of the input matrix 500. The reshape circuits include a multiplexer tree 713 having inputs connected to the buffers 711, 712. The multiplexer tree 713 is configured so that a multiplexer selects the first element of an output vector from the first row of the first atom stored in the buffers 711, 712. Likewise, a multiplexer selects the second element of the output vector from the second row of the first atom stored in the buffers 711, 712. The multiplexer selects the third element of the output vector from the first row of the second atom. A multiplexer selects the fourth element of the output vector from the second row of the second atom. A multiplexer selects the fifth element of the output vector from the first row of the third atom. The multiplexer selects the sixth element of the output vector from the second row of the third atom. A multiplexer selects the seventh element of the output vector from the first row of the fourth atom. A multiplexer selects the eighth element of the output vector from the second row of the fourth atom. A control signal is used to control the multiplexer tree. For reading out the first column, the control signal RT0 is applied to an output register 714 in which the first column of the input matrix 500 is written. Also shown in FIG. 7, when the control signal is set to RT1, the second column of the input matrix 500 is written in the output register 714.

Figure 8:
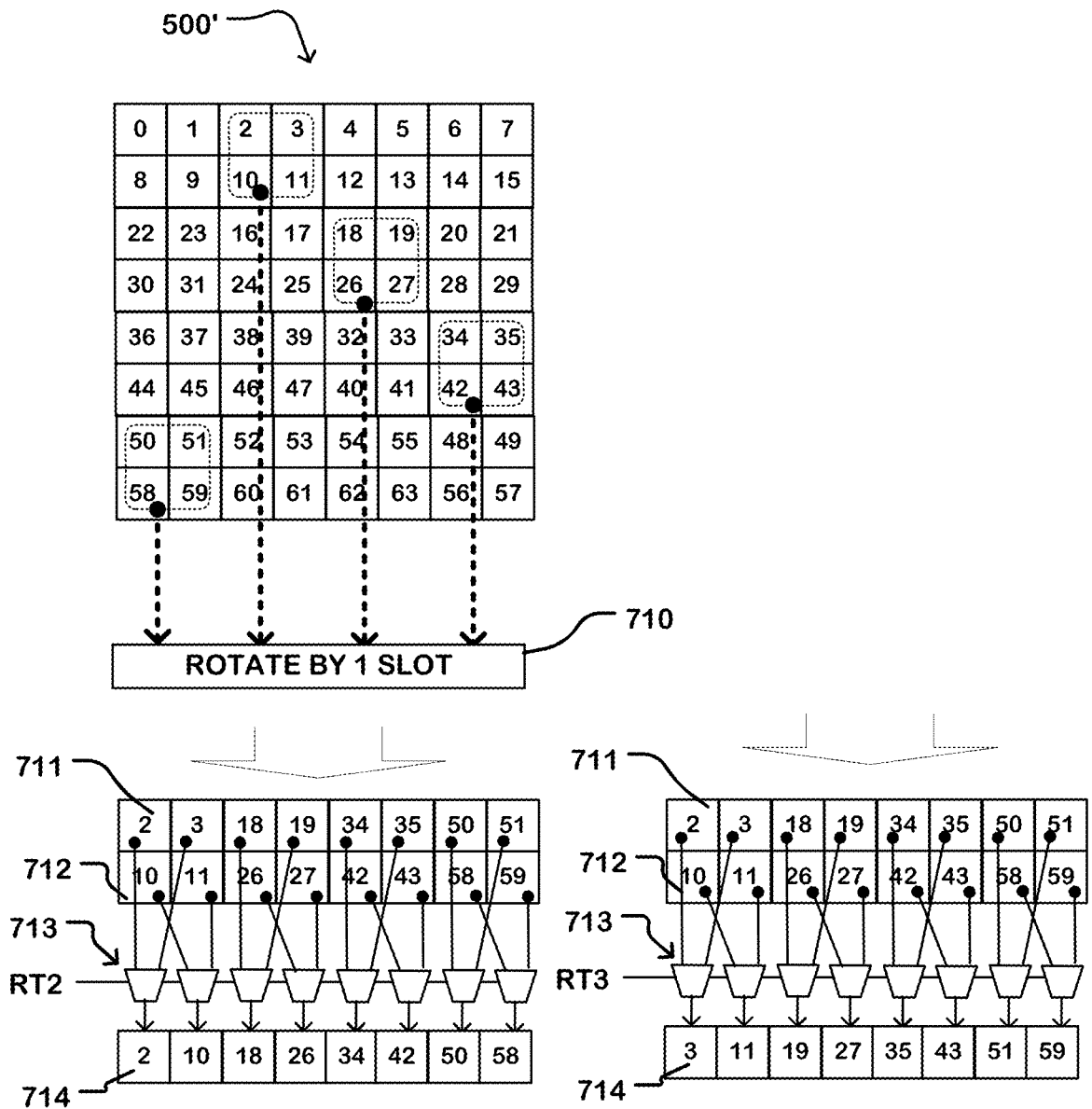

FIG. 8 illustrates the procedure for reading the third and fourth columns from the input matrix 500 using the as-written matrix 500'. In this example, the slot row addresses are rotated counterclockwise fashion by one atom. Thus, the output of slot S0 is the fourth atom in the column of atoms. The output of slot S1 is the first atom in the column of atoms. The output of slot S2 is the second atom in the column of atoms. The output of slot S3 is the third atom in the column of atoms. The outputs for reading the third and fourth columns are rotated in the rotation logic 710 by 1 slot width, to undo the rotation imposed by the as-written matrix 500'. The as-rotated data is stored in the buffers 711, 712, and through the multiplexer tree 713 to the output register 714 which receives the third column of the input matrix 500 in response to the signal RT2, and then the fourth column of the input matrix 500 in response to the signal RT3.

Figure 9:
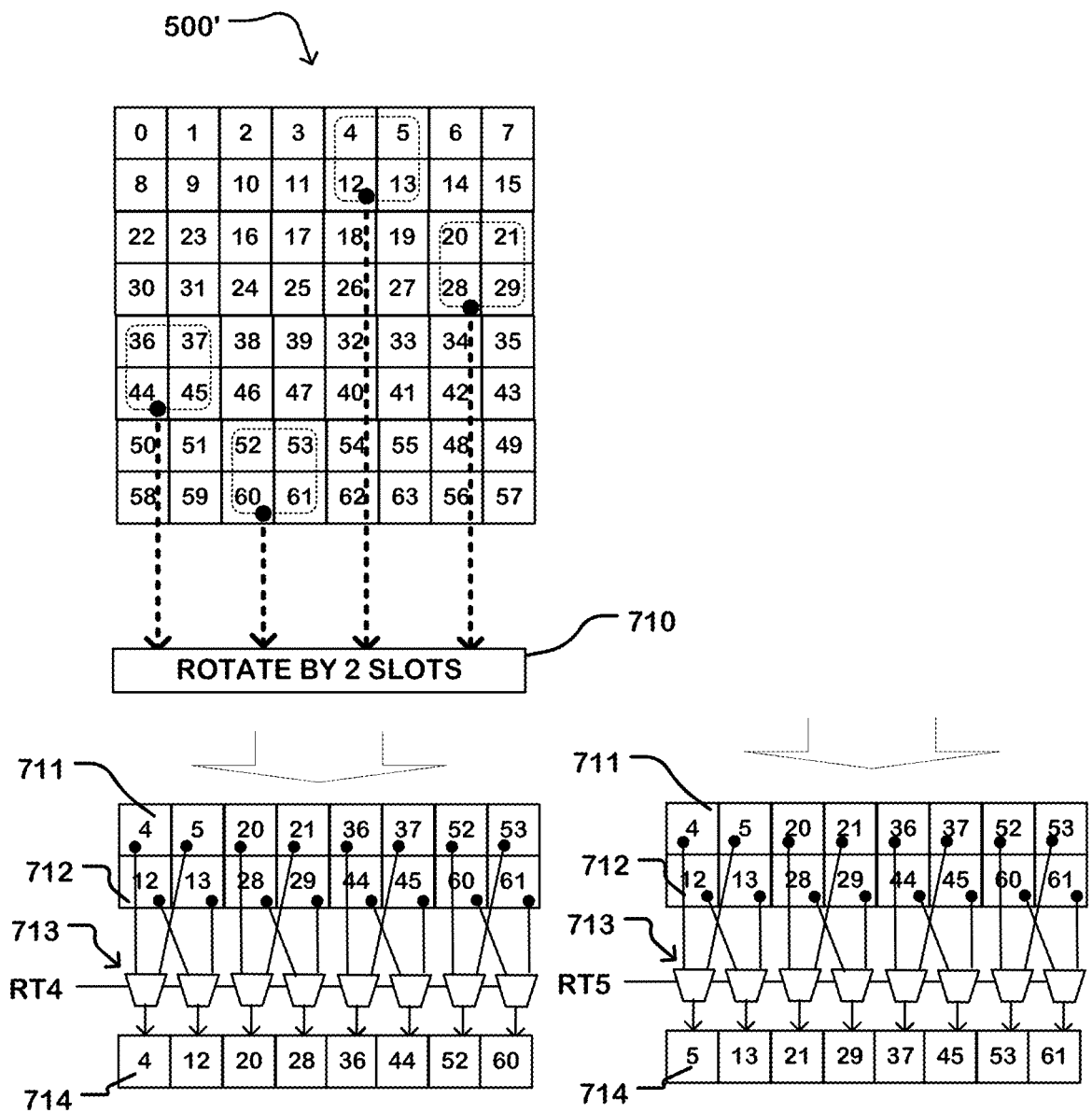

FIG. 9 illustrates the procedure for reading the fifth and sixth columns from the input matrix 500 using the as-written matrix 500'. In this example, the slot row addresses are rotated counterclockwise fashion by two atoms (relative to FIG. 7). Thus the output of slot S0 is the third atom in the column of atoms. The output of slot S1 is the fourth atom in the column of atoms. The output of slot S2 is the first atom in the column of atoms. The output of slot S3 is the second atom in the column of atoms. The outputs for reading the fifth and sixth columns are rotated in the rotation logic 710 by two slot widths, to undo the rotation imposed by the as-written matrix 500'. The as-rotated data is stored in the buffers 711, 712, and through the multiplexer tree 713 to the output register 714 which receives the fifth column of the input matrix 500 in response to the signal RT4, and then the sixth column of the input matrix 500 in response to the signal RT5.

Figure 10:
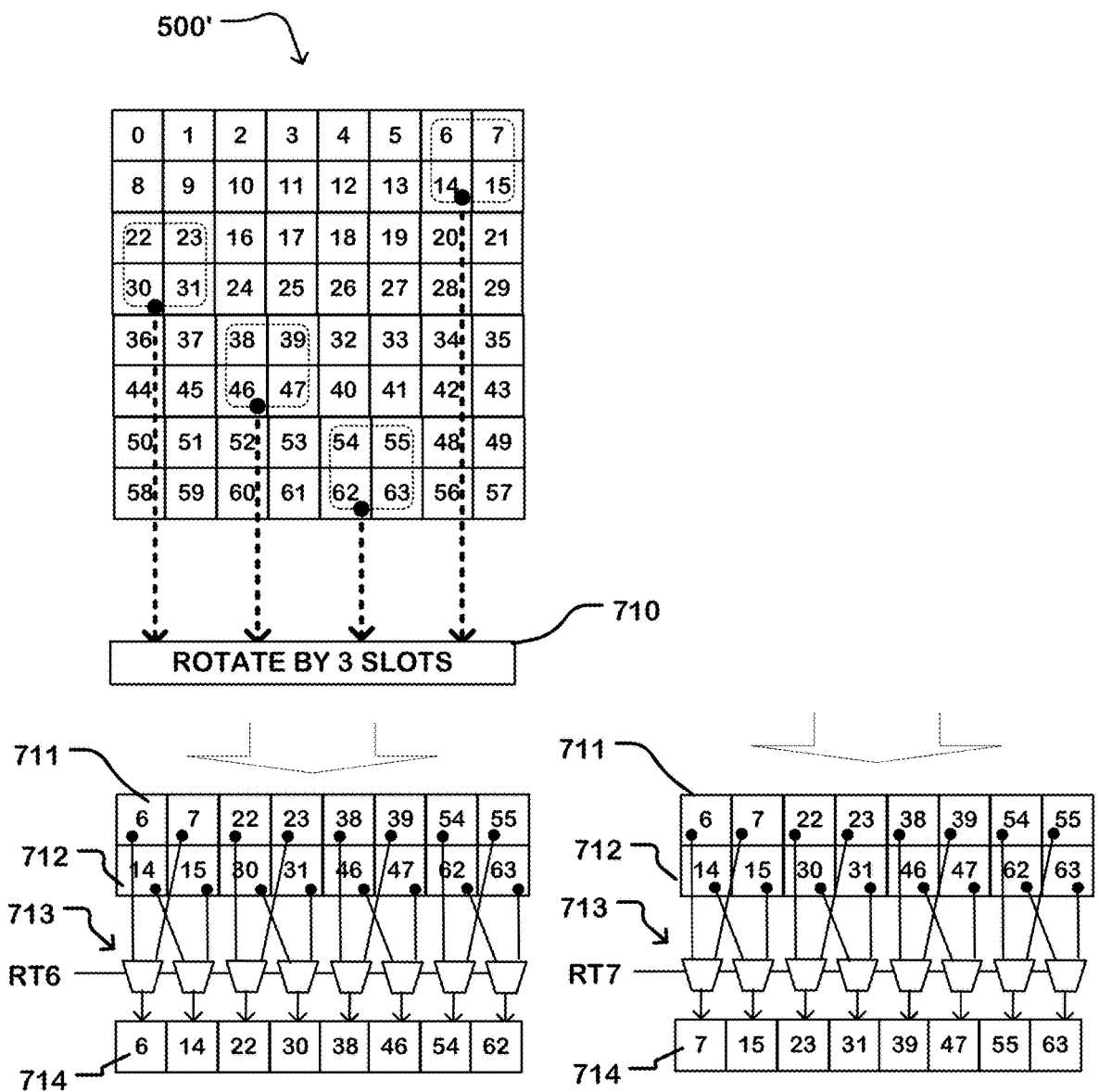

FIG. 10 illustrates the procedure for reading the seventh and eighth columns from the input matrix 500 using the as-written matrix 500'. In this example, the slot row addresses are rotated in counterclockwise fashion by three atoms (relative to FIG. 7). Thus, the output of slot S0 is the second atom in the column of atoms. The output of slot S1 is the third atom in the column of atoms. The output of slot S2 is the fourth atom in the column of atoms. The output of slot S3 is the first atom in the column of atoms. The outputs for reading the seventh and eighth columns are rotated in the rotation logic 710 by 3 slot widths, to undo the rotation imposed by the as-written matrix 500'. The as-rotated data is stored in the buffers 711, 712, and through the multiplexer tree 713 to the output register 714 which receives the seventh column of the input matrix 500 in response to the signal RT6, and then the eighth column of the input matrix 500 in response to the signal RT7.

As mentioned above, the procedure is configurable according to the data width D of the elements of the matrix. The transpose read logic selects atoms in the slots according to the column number to be read out, and stores the selected atoms in a reshape circuit in a manner that undoes the rotation used during the write. Also, circuits in the reshape circuit transpose the selected atoms as stored in the reshape circuit to form the output vectors of the transpose read of the matrix.

In FIGS. 7-10, the procedure is shown for a matrix having elements with a data width that is one half of the slot width, making for atoms that are 2×2. When the circuitry is configured for a data width that is one fourth of the slot width, then atoms are 4×4. The logic for slot row addressing remains the same, however. The reshape circuit, however, requires a depth of at least four registers to handle a 4×4 atom. It can be seen that the reshape buffer for a particular embodiment can be configured for the maximum number of rows per atom, which corresponds with the smallest data width to be supported.

Figure 11:
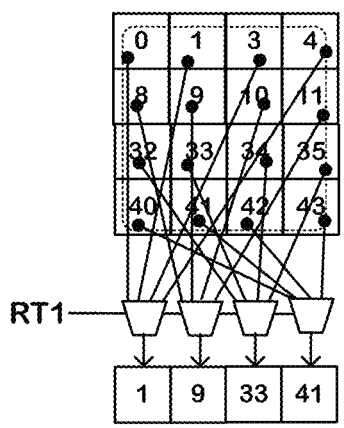
FIG. 11 illustrates a transpose read operation for an atom having a size of 4×4.

FIG. 11 illustrates a reshape circuit configured for a 4×4 atom. Only a single atom is illustrated. Of course, the circuitry is preferably configured according to the maximum width of the output vector which can be read from the memory in parallel, in order to accommodate a matrix requiring the full width.

As can be seen in FIG. 11, the reshape circuit for a 4×4 atom can be implemented utilizing a buffer four registers deep and having four multiplexers, one for each of four output elements per cycle. As illustrated, the first element in the output is provided by a multiplexer having inputs connected to each of the elements in the first row of the atom. The second element in the output is provided by a multiplexer having inputs connected to each of the elements in the second row of the atom. The third element in the output is provided by a multiplexer having inputs connected to each of the elements in the third row of the atom. The fourth element in the output is provided by a multiplexer having inputs connected to each of the elements in the fourth row of the atom.

Figure 12:
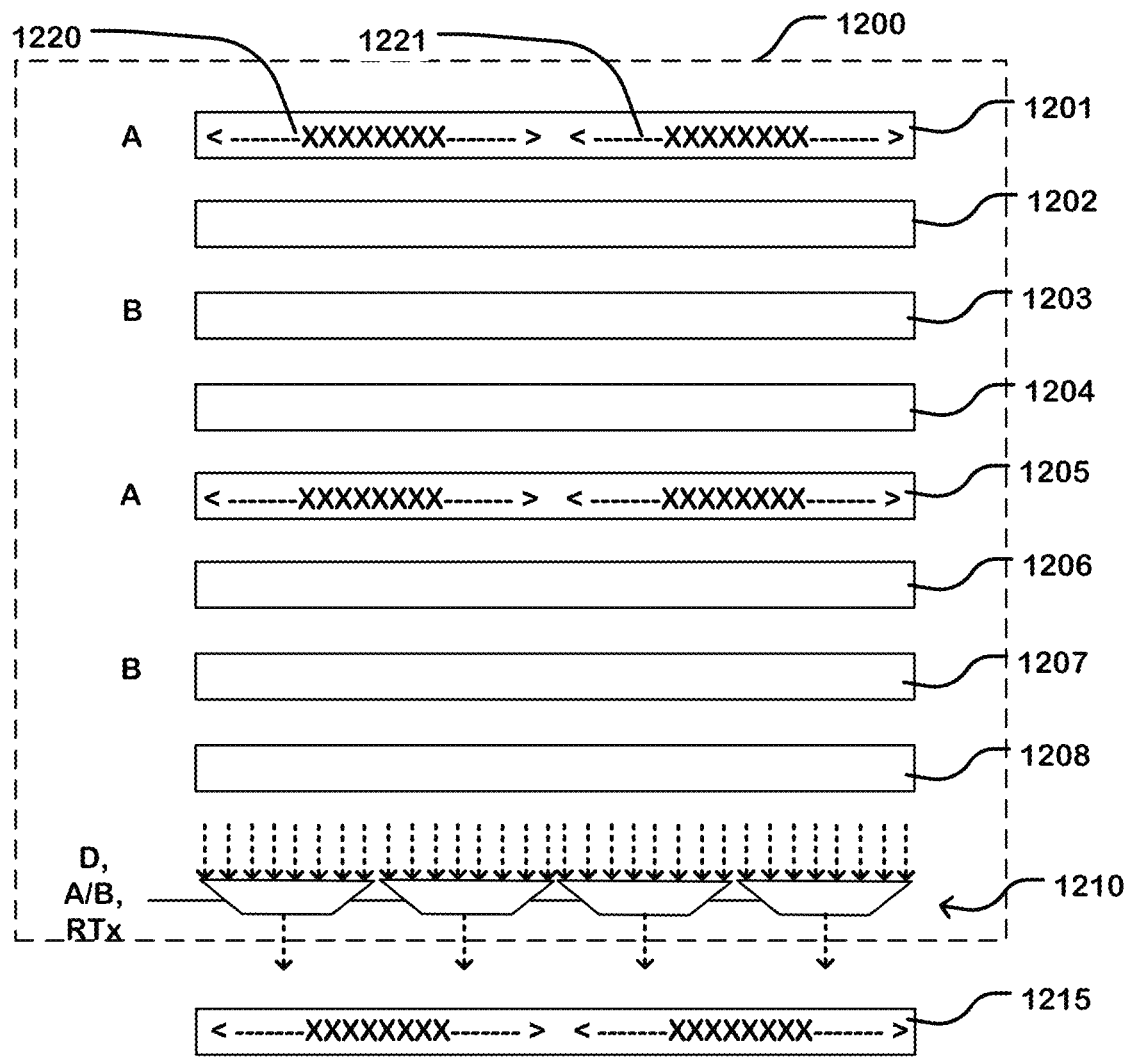
FIG. 12 illustrates an example of a reshape buffer and multiplexer tree configurable according to data width as described herein, for an atom size of 2×2.
Figure 13:
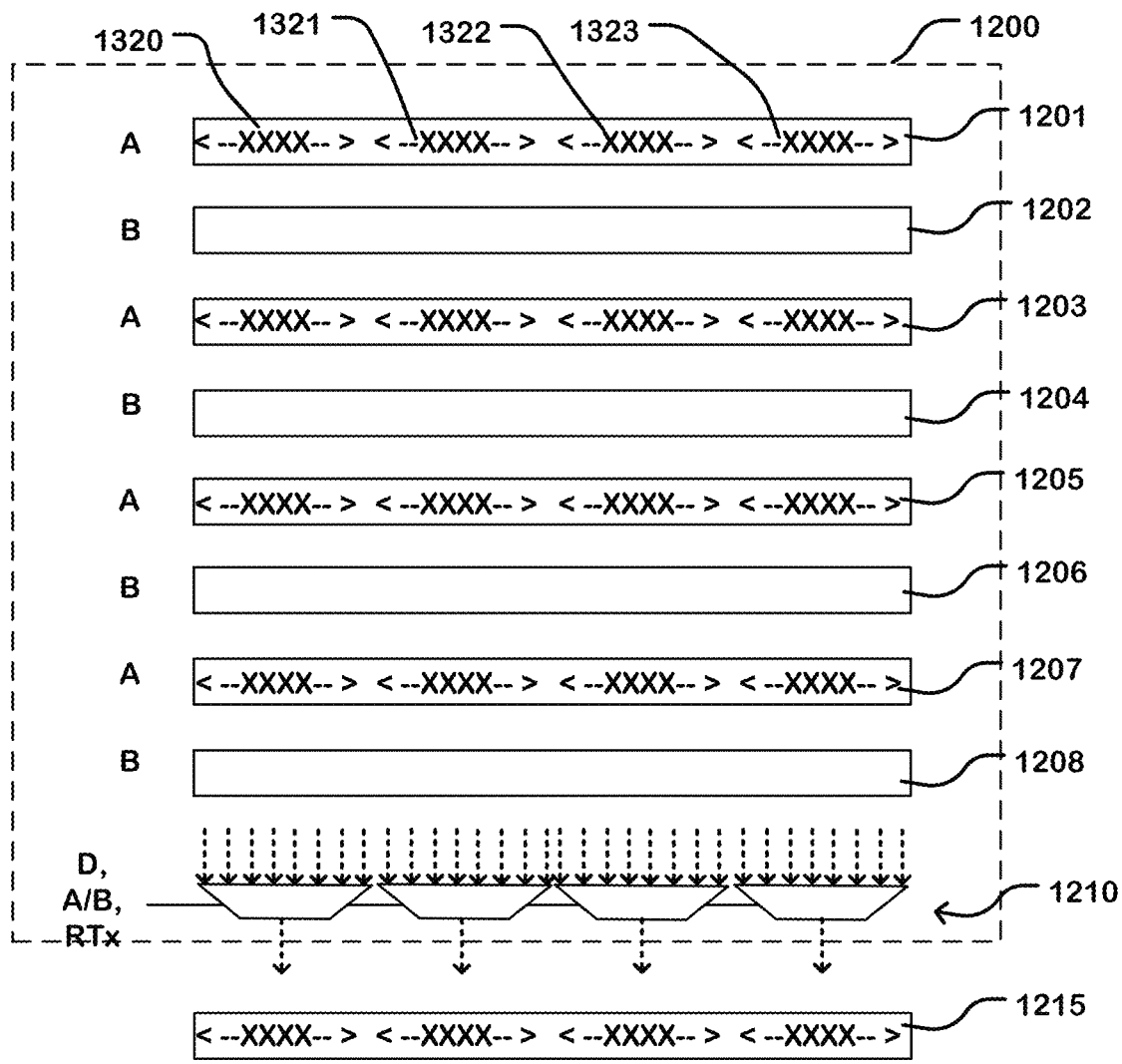
FIG. 13 illustrates an example of the reshape buffer and multiplexer tree of FIG. 11 configured for an atom size of 4×4.

FIGS. 12 and 13 illustrate a structure of a reshape circuit 1200 for a slot of the memory which can be operated in a double buffering format, and used for a plurality of data widths. Referring to FIG. 12, the reshape circuit includes a FIFO with eight levels, 1201-1208, usable in double buffered sets of levels. The eight levels 1201-1208 of the FIFO are coupled to a multiplexer tree 1210. The output of the multiplexer tree is applied to an output register 1215. The multiplexer tree 1210 is controlled in response to a data width D, a double buffering signal AB and a column select signal RTx. FIG. 12 illustrates operation for a 2×2 atom in which each slot row holds two elements and outputs two elements (e.g. 1220, 1221) to the FIFO in parallel in response to a slot row address. For a double buffering operation, the FIFO can be configured to utilize levels 1201 and 1205 for a first one (A) of the double buffered sets, and levels 1203 and 1207 for a second one (B) of the double buffered sets. The multiplexer tree 1210 has inputs connected to the levels of the FIFO with sufficient density to handle the smallest data width the circuit is configurable to utilize. Also, the multiplexer tree 1210 can be operated without double buffering if desired.

FIG. 13 illustrates the reshape circuit 1200 for a slot of the memory configured for a 4×4 atom in which each slot row holds four elements and outputs four elements (e.g. 1320, 1321, 1322, 1323) to the FIFO in parallel in response to a slot row address. In this configuration, the reshape circuit can operate in a double buffered procedure utilizing FIFO levels 1201, 1203, 1205, 1207 for a first one (A) of the double buffered sets, and levels 1202, 1204, 1206, 1208 for a second one (B) of the double buffered sets.

Utilizing double buffering, the latency involved in outputting rows of atoms into the reshape circuit 1200 in terms of the number of memory clock cycles can be absorbed by the double buffering. This supports outputting a transpose read at a data rate which matches the memory access rate and, in preferred embodiments, also matches the bus rate for the bus to which the transpose read vector is being delivered.

Figure 14:
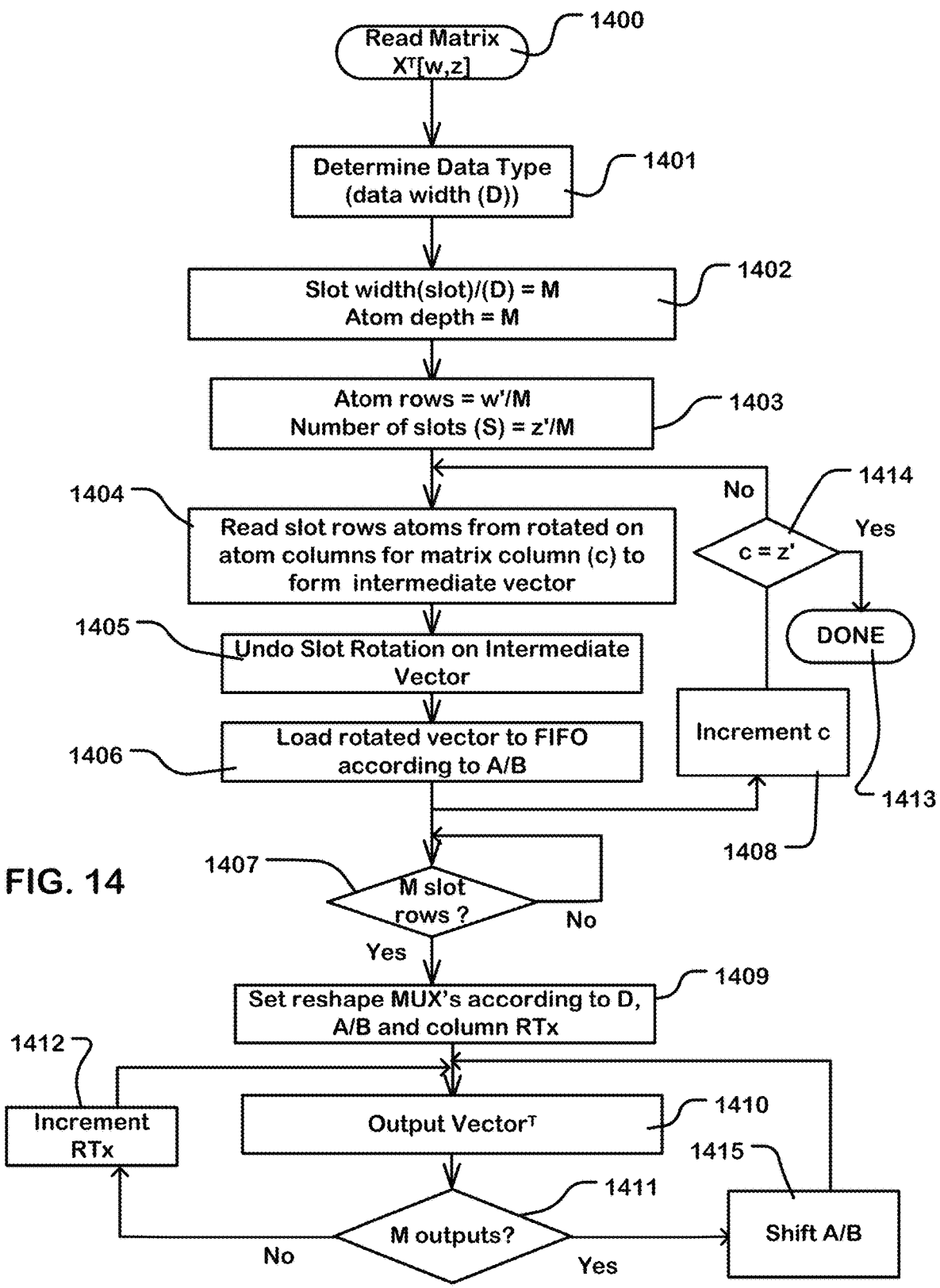
FIG. 14 is a flowchart illustrating logic for a transpose read as described herein.

FIG. 14 is a flowchart illustrating an example of transpose read logic in a configurable circuit like that of FIG. 4. The flowchart shows functions for a transpose read of columns c in a matrix $X^T$ [w,z] stored on a row major format shifted as discussed above in connection with FIGS. 5 and 6 (step 1400). The logic includes determining a data type of elements of the matrix or other indicator of data width D (step 1401). Also, parameters of the atoms are determined by dividing the slot width (slot) by the data width (D) of the elements of the matrix to determine the parameter M equal the atom depth, which is also the number of rows and columns of an atom (step 1402). In some embodiments, the parameter M may be provided by configuration data. The matrix having been padded if needed to a number of columns z' and a number of rows w', includes w'/M rows of atoms stored in a number of slots (S) which is equal to z'/M (up to the maximum number of slots supported by the circuits) (step 1403).

The logic operates to select an atom from each of the slots so that in combination the selected atoms include the contents of the column c of the input matrix to be read, and loads the selected atoms into the reshape circuit, where the elements of the atoms are output in a transpose order to form vectors equal to the selected column.

In the embodiment illustrated in FIG. 14, in each clock cycle, the logic reads the slot rows of atoms rotated on the atom columns for the selected column (c), to form an intermediate vector (step 1404). Next, the intermediate vector is rotated, using for example the crossbar, to undo the slot rotation from the write operation to form a rotated vector (step 1405). Then, the rotated vector is loaded in to the FIFO according to the status of the double buffering A/B. Then, the logic increments the column number c (step 1408) and continues to read atoms to complete the matrix. The logic then tests to determine whether the last column z* of the matrix, as padded to include a full atom, has been read (step 1414). If the last column has been read, then the read-out procedure is complete (step 1413). If not, the algorithm returns to step 1404 to read the next set of slot rows. As the read-out procedure executes, the logic monitors to detect when a full set of selected atoms has been loaded to the reshape buffer FIFO, including M slot row reads (step 1407). If at step 1407, a full atom (corresponding to having read M slot rows in this loop) has been read, then the rotated vector is applied to the reshape circuit. The reshape circuit is set according to the data width D, the double buffering parameter A/B, and the column to be read out RTx (step 1409). The reshape circuit outputs the selected column as an output vector from the selected column from the transpose read (step 1410). Next the logic determines whether M columns for the row of selected atoms have been output (step 1411). If not, then the column to be output RTx is incremented (step 1412) and the logic returns to step 1410 to output the next output vector on the next clock cycle (step 1410). If the last column of the row of atoms in the FIFO has been read at step 1411, then the logic shifts the double buffering parameter A/B (step 1415), and outputs the next vector (step 1410) on the next clock cycle from the next set of atoms. If the last column has not been read, then a next set of slots is processed beginning at step 1404.

In a double buffering implementation, the steps 1404-1406 can be executed for one selected set of slots and loaded into a first set of registers in the reshape circuit, while the steps 1407-1412 are executed for a previously selected set of slots stored in a second set of registers in the reshape circuit. The transpose read stops when all the specified columns of the matrix have been read.

Figure 15:
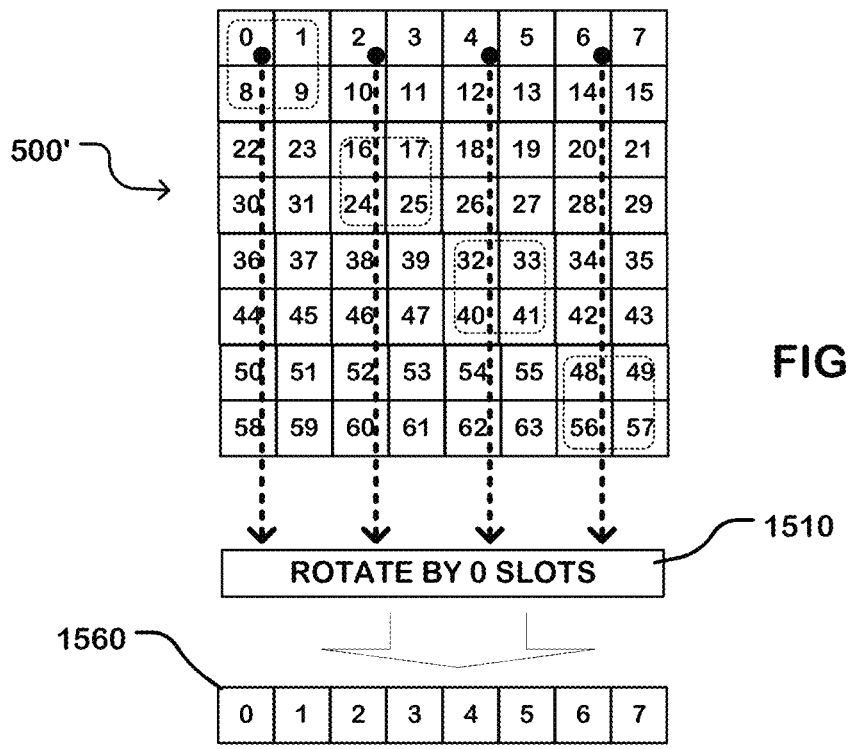
FIGS. 15 and 16 illustrate a normal read operation for a memory circuit as described herein having an atom size of 2×2.
Figure 16:
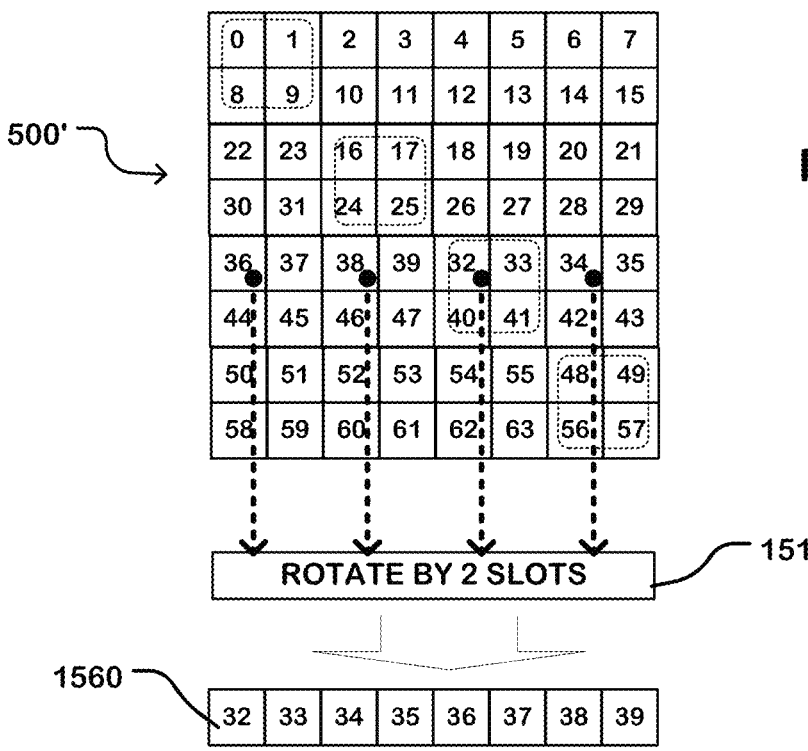

As discussed with reference to FIG. 4, embodiments of the technology utilize a memory 410 including 2 read ports operable in parallel, where a first port supports a normal read and a second port supports the transpose read. FIGS. 15 and 16 illustrate a procedure utilized for a normal read when the matrix has been written as discussed above with reference to FIGS. 5 and 6 to support the transpose read operation. In FIG. 15, the matrix 500' is illustrated in the as-written form described with reference to FIG. 5. To read out the first row of the matrix in a row major format, a read address selecting all the cells in the first row of the as-written matrix 500' are output to rotation logic 1510, which is implemented using a crossbar, for example. For the first row of atoms, the rotation logic 1510 performs no rotation, and the first row of the matrix is output to register 1560. Thus, for all of the rows in the first row of atoms in the matrix 500', a normal row major read can be executed on each clock cycle with no rotation performed in the rotation logic. For the other rows of atoms, which have been rotated, rotation logic is utilized to undo the rotation. Thus, as shown in FIG. 16, the logic reads out the matrix by outputting all of the elements in the fifth row of the as-written matrix, and applying them to the rotation logic 1510. The fifth row of the matrix is in the third row of slots, and must be rotated by the amount equal to the quotient of the row number (i) divided by the slot width M. For the fifth row, this quotient is two. After rotation by 2 slots, the vector is output to the register 1560, in the row major form of the original input vector 500.

Figure 17:
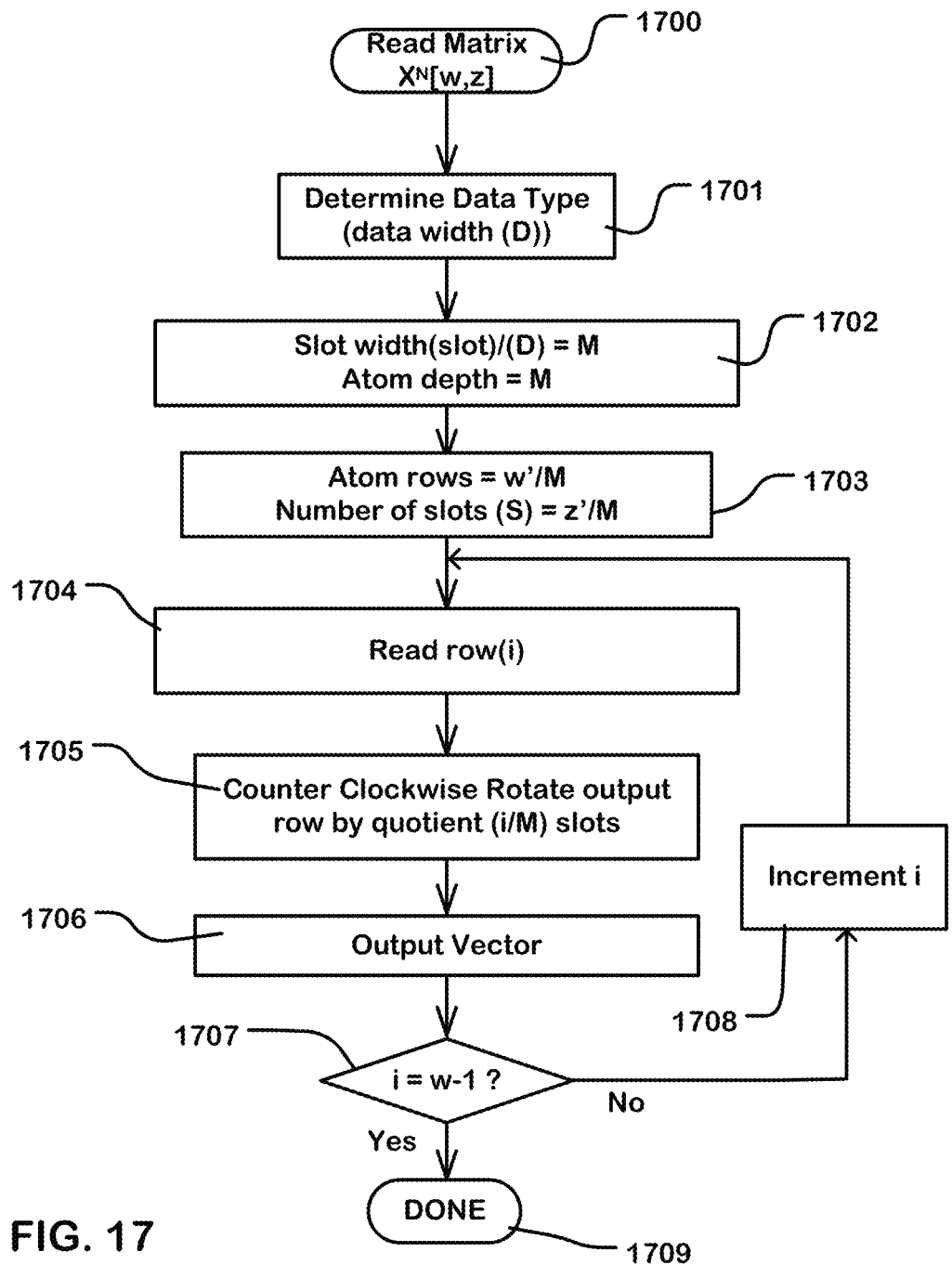
FIG. 17 is a flowchart illustrating logic for a normal read operation as described herein.

FIG. 17 is a flowchart illustrating an example of normal read logic in a configurable circuit like that of FIG. 4. The flowchart shows functions for a normal read of rows (i) in a matrix X[w,z] stored in a row major format, shifted as discussed above in connection with FIGS. 5 and 6 (step 1700). The logic includes determining a data type of elements of the matrix or other indicator of data width D (step 1701). Also, parameters of the atoms are determined by dividing the slot width (slot) by the data width (D) of the elements of the matrix to determine the parameter M, which is the number of rows and columns of an atom (step 1702). The matrix having been padded to a number of rows w' and a number of columns z', includes w'/M rows of atoms stored in a number of slots (S) which is equal to z'/M (up to the maximum number of slots supported by the circuits) (step 1703).

To read row (i) of the input matrix 500, row (i) of the as-written matrix 500' is read to rotation logic (step 1704). When the first row of the input matrix is to be read, the logic starts with i=0. Next, the rotation logic rotates the row by a number of slots equal to the quotient of the row number (i) divided by the atom depth M (step 1705). The rotated vector is then output to an output register (step 1706). Logic then determines whether i has reached w−1, indicating that all of the rows of the input matrix have been read (excluding padding) (step 1707). If not, then the row number is incremented (step 1708) and the logic returns to step 1704 to complete the readout of the selected number of rows. If at step 1707, all the rows of been read, then the algorithm complete (step 1709).

For matrices that are larger than the memory in a given configurable circuit, the input matrix can be divided among a plurality of memory circuits supporting the transpose read, and executed in parts.

A number of flowcharts illustrating logic are described herein. The logic can be implemented using processors programmed using computer programs stored in memory accessible to the computer systems and executable by the processors, by dedicated logic hardware, including field programmable integrated circuits, and by combinations of dedicated logic hardware and computer programs. With all flowcharts herein, it will be appreciated that many of the steps can be combined, performed in parallel or performed in a different sequence without affecting the functions achieved. In some cases, as the reader will appreciate, a rearrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that numerous additional steps, or alternative steps, for accomplishing other functions can be performed before, after and between those shown.

Embodiments of the circuit for normal and transpose reads described herein are configurable according to the data width of elements of the matrices. In other embodiments, the circuit can be implemented in a hard-wired manner for a particular data width. In embodiments of the circuit described herein the normal and transpose read logic are operable in parallel, using different read ports on the memory. In other embodiments, a single read port can be shared by logic for transpose read and normal read.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. What is claimed is:

The invention claimed is:

1. A configurable circuit, comprising:
    a memory array;
    logic to write a matrix to the memory array, the matrix having elements with a data width having a number D of bits of data;
    transpose read logic configurable according to the data width, to output vectors of a transpose read of the matrix; and
    normal read logic to output vectors of a normal read of the matrix;
    wherein the transpose read logic and the normal read logic are operable on the memory array to output in parallel respective vectors in transposed and normal orders.

2. The circuit of claim 1, wherein the memory array includes a first read port and a second read port, and the normal read logic is operably coupled to the first read port and the transpose read logic is operably coupled to the second read port.

3. A configurable circuit, comprising:
    a memory array;
    logic to write a matrix to the memory array, the matrix having elements with a data width having a number D of bits of data;
    transpose read logic configurable according to the data width, to output vectors of a transpose read of the matrix; and
    normal read logic to output vectors of a normal read of the matrix;
    wherein the memory array includes a plurality of slots, where slots in the plurality of slots include have a slot width (number of columns) equal to a multiple M greater than 1 of the data width.

4. The circuit of claim 3, wherein the logic to write comprises logic to organize sets of M rows of the matrix in the memory into a plurality of rows of atoms of M by M elements, atoms in a row of atoms being stored in respective slots in the plurality of slots, and rotated in position in the row of atoms relative to an input matrix as a function of a row number of the row of atoms in the plurality of rows of atoms.

5. The circuit of claim 4, wherein the transpose read logic includes logic to select atoms in the slots, and store the selected atoms in a reshape circuit, and logic to transpose the selected atoms to form the output vectors of the transpose read of the matrix.

6. The circuit of claim 5, wherein the reshape circuit includes a FIFO buffer having a depth at least as high as a maximum of M according to the data width of the elements of the matrix, and the logic to transpose the atoms includes a multiplexer tree configurable according to the data width.

7. The circuit of claim 5, including logic to operate the reshape circuit using double buffering.

8. The circuit of claim 5, wherein the transpose read logic is configurable for a selected one of a plurality of data types, and in which the data width differs for different data types in the plurality of data types.

9. The circuit of claim 3, wherein the transpose read logic is configurable for a selected one of a plurality of data types, and the data widths differ for different data types in the plurality of data types, and the slot width is at least two times a maximum of the data width of data types in the plurality of data types.

10. A reconfigurable data processor, comprising:
    an array of configurable units; and
    a bus system connected to the array of configurable units which communicates data at a bus clock rate; wherein a configurable unit in the array of configurable units includes:
        a memory array,
        logic to write a matrix to the memory array at the bus clock rate, the matrix having elements with a data width having a number D of bits of data; and
        transpose read logic configurable according to the data width, to output vectors of a transpose read of the matrix at the bus clock rate,
        wherein the transpose read logic and the normal read logic are operable on the memory array to output in parallel respective vectors in transposed and normal orders.

11. The reconfigurable data processor of claim 10, including normal read logic configurable according to the data width, to output vectors of a normal read of the matrix at the bus clock rate, and wherein the memory array includes a first read port and a second read port, and the normal read port is operably coupled to the first read port, and the transpose read logic is operably coupled to the second read port.

12. A reconfigurable data processor, comprising:
    an array of configurable units; and
    a bus system connected to the array of configurable units which communicates data at a bus clock rate; wherein a configurable unit in the array of configurable units includes:
        a memory array,
        logic to write a matrix to the memory array at the bus clock rate, the matrix having elements with a data width having a number D of bits of data; and transpose read logic configurable according to the data width, to output vectors of a transpose read of the matrix at the bus clock rate;

wherein the memory array includes a plurality of slots, where slots in the plurality of slots include having a slot width (number of columns) equal to a multiple M greater than 1 of the data width.

13. The reconfigurable data processor of claim 12, wherein the transpose read logic includes write logic to organize sets of M rows of the matrix in the memory into a plurality of rows of atoms of M by M elements, atoms in a row of atoms being stored in respective slots in the plurality of slots, and rotated in position in the row of atoms relative to an input matrix as a function of a row number of the row of atoms in the plurality of rows of atoms.

14. The reconfigurable data processor of claim 13, wherein the transpose read logic includes logic to select atoms in the slots, and store the selected atoms in a reshape circuit, the reshape circuit including circuits to transpose the selected atoms to form the output vectors of the transpose read of the matrix.

15. The reconfigurable data processor of claim 14, wherein the reshape circuit includes a FIFO buffer having a depth at least as high as a maximum of M according to the data type of the elements of the matrix, and the circuit to transpose the atoms comprises a multiplexer tree configurable according to the data width.

16. The reconfigurable data processor of claim 14, including logic to operate the reshape circuit using double buffering.

17. The reconfigurable data processor of claim 14, wherein the transpose read logic is configurable for a selected one of a plurality of data types, and in which the data width differs for different data types in the plurality of data types.

18. The reconfigurable data processor of claim 12, wherein the transpose read logic is configurable for a selected one of a plurality of data types, and in which the data width differs for different data types in the plurality of data types, and the slot width is at least two times a maximum of the data width of data types in the plurality of data types.

19. A memory circuit, comprising:
a memory array;
write logic to write a matrix to the memory array, the matrix having elements with a data width having a number D of bits of data, wherein the memory array includes a plurality of slots readable in parallel on different rows, where slots in the plurality of slots have a slot width equal to a multiple M of the data width, with logic to organize, when M is greater than 1, sets of M rows of the matrix in the memory array into a plurality of rows of atoms of M by M elements, so that atoms in a row of atoms are stored in respective slots in the plurality of slots, and rotated in position in the row of atoms relative to an input matrix as a function of a row number of the row of atoms in the plurality of rows of atoms; and transpose read logic to output vectors of a transpose read of the matrix, including logic to select atoms in the slots, and store the selected atoms in a reshape circuit, the reshape circuit including circuits to transpose the selected atoms to form output vectors of a transpose read of the matrix.

20. The circuit of claim 19, wherein the memory array includes a first read port and a second read port, and including normal read logic to output vectors of a normal read of the matrix operably coupled to the first read port, wherein the transpose read logic is operably coupled to the second read port.

21. The circuit of claim 20, wherein the first read port and the second read port are operable in parallel.

22. The circuit of claim 19, wherein the reshape circuit includes a FIFO buffer having a depth at least as high as a maximum of M according to the data width, and a multiplexer tree.

23. The circuit of claim 22, including logic to operate the FIFO using double buffering.

24. The circuit of claim 19, wherein the slot width is at least two times a maximum of the data width.

25. A memory circuit for transpose read of a matrix, comprising:
memory;
means for organizing sets of M rows of a matrix into a plurality of slots having a slot width of M elements in the memory into a plurality of rows of atoms of M by M elements, atoms in a row of atoms being stored in respective slots in the memory, and rotated in position in the row of atoms relative to an input matrix as a function of a row number of the row of atoms in the plurality of rows of atoms; and
means for selecting atoms in the slots to be read, and transposing the selected atoms to form output vectors of the transpose read of the matrix.

* * * * *